(12) United States Patent
Ohmori et al.

(10) Patent No.: US 7,196,455 B2
(45) Date of Patent: Mar. 27, 2007

(54) CELL DRIVING TYPE PIEZOELECTRIC/ELECTROSTRICTIVE ACTUATOR AND METHOD OF MANUFACTURING THE SAME

(75) Inventors: Makoto Ohmori, Nagoya (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 226 days.

(21) Appl. No.: 10/971,525

(22) Filed: Oct. 22, 2004

(65) Prior Publication Data

US 2005/0093394 A1 May 5, 2005

(30) Foreign Application Priority Data

| Oct. 30, 2003 | (JP) | ............................. 2003-370594 |
| May 28, 2004 | (JP) | ............................. 2004-159779 |
| Aug. 30, 2004 | (JP) | ............................. 2004-249798 |

(51) Int. Cl.
*B41J 2/045* (2006.01)
(52) U.S. Cl. ...................... 310/324; 310/363; 310/364; 347/70; 347/71; 347/72
(58) Field of Classification Search ...................... None
See application file for complete search history.

(56) References Cited

U.S. PATENT DOCUMENTS

| 5,475,407 | A | * | 12/1995 | Ohashi | ......................... 347/69 |
| 5,677,717 | A | * | 10/1997 | Ohashi | ......................... 347/69 |
| 5,980,027 | A | * | 11/1999 | Yoshimura | .................... 347/68 |
| 6,045,213 | A | | 4/2000 | Kishimoto et al. | |
| 6,618,943 | B2 | * | 9/2003 | Ashe et al. | ................. 29/890.1 |
| 6,808,250 | B2 | * | 10/2004 | Watanabe | .................... 347/45 |
| 2001/0030673 | A1 | | 10/2001 | Shigemura | |
| 2002/0012028 | A1 | * | 1/2002 | Oota | ........................... 347/66 |
| 2003/0052949 | A1 | * | 3/2003 | Watanabe | .................... 347/68 |

FOREIGN PATENT DOCUMENTS

| JP | 07-081055 | | 3/1995 |
| JP | 08052872 | A * | 2/1996 |
| JP | 10-128984 | | 5/1998 |
| JP | 3217006 | | 8/2001 |
| JP | 3412090 | | 3/2003 |

* cited by examiner

*Primary Examiner*—Darren Schuberg
*Assistant Examiner*—J. Aguirrechea
(74) *Attorney, Agent, or Firm*—Burr & Brown

(57) ABSTRACT

A cell driving type piezoelectric/electrostrictive actuator comprises: one or a plurality of cells defined by a wall portion including side walls, a ceiling wall and a bottom wall: side walls, the ceiling wall and the bottom wall being connected to form a space as cell, at least two side walls facing each other comprising piezoelectric/electrostrictive operation portions, the piezoelectric/electrostrictive operation portions being displaced to change a volume of the cell, wherein at least one pore is disposed in the wall portion other than at least two side walls facing each other and comprising piezoelectric/electrostrictive operation portions, and wherein all inner surfaces of the wall portion defining each cell are coated with one or more layers of seamless thin films. The method for preparing the same is also disclosed.

27 Claims, 12 Drawing Sheets

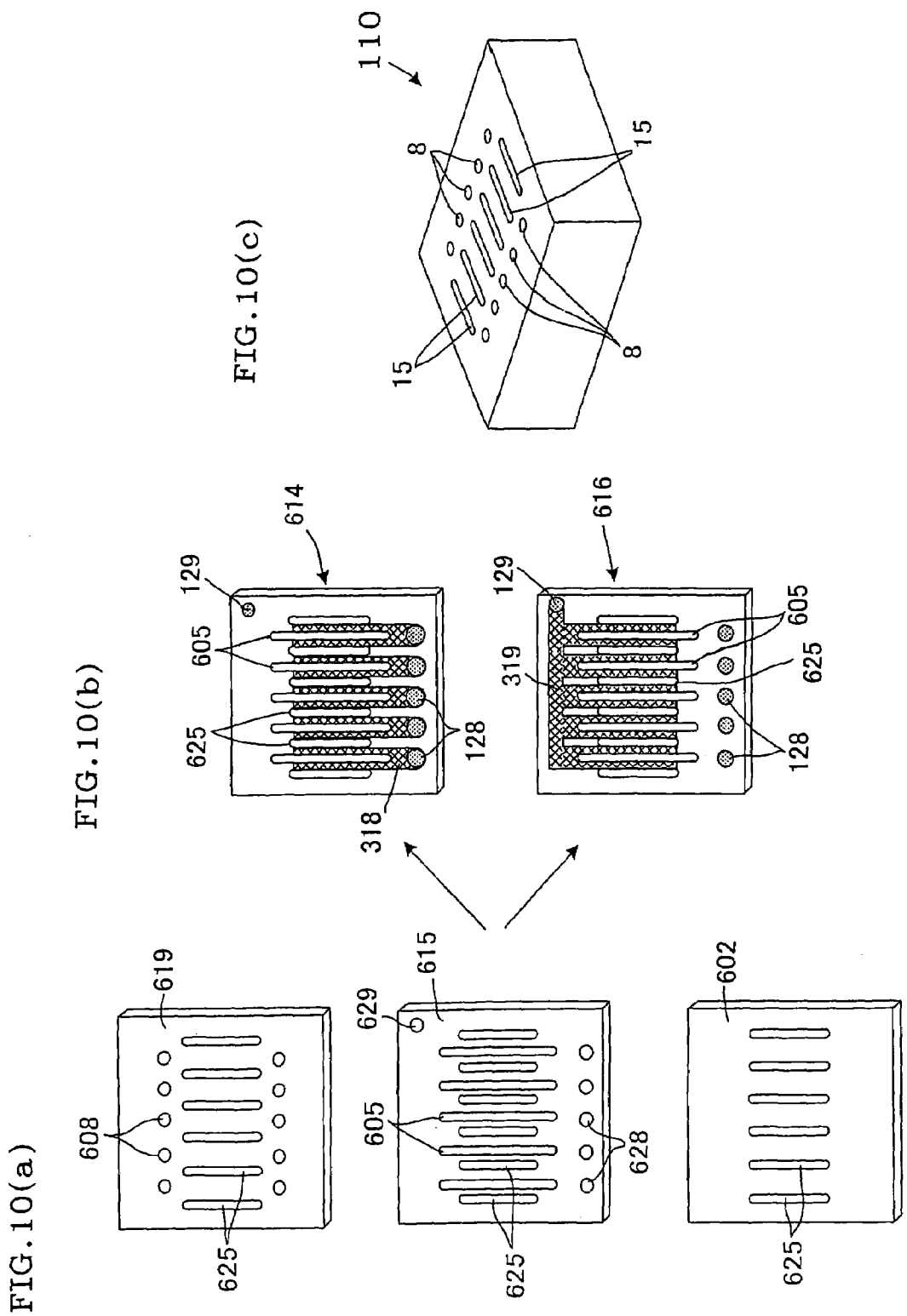

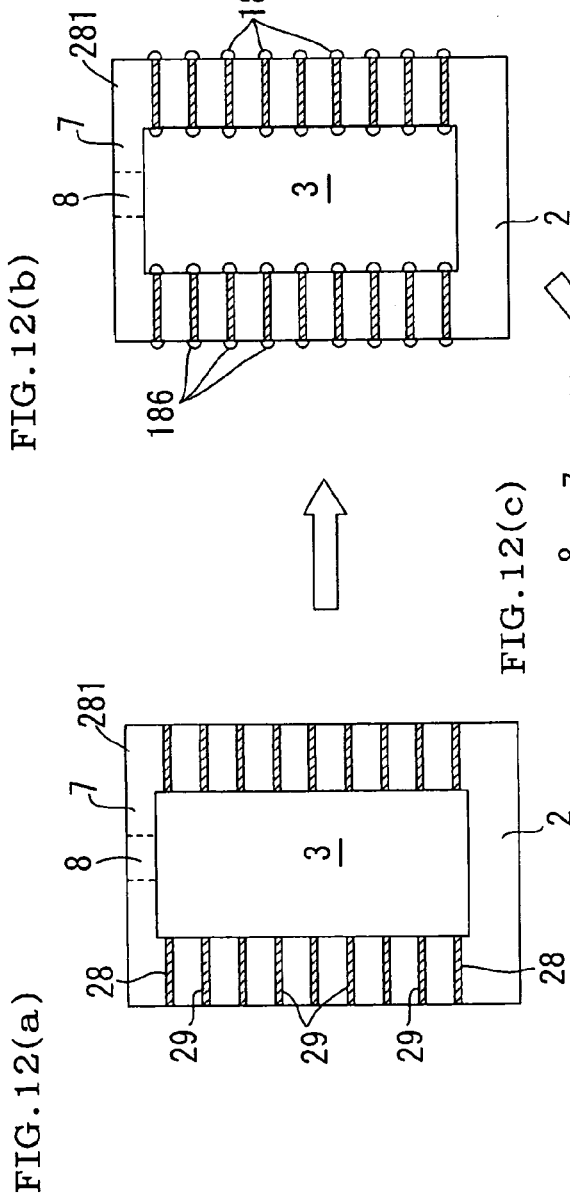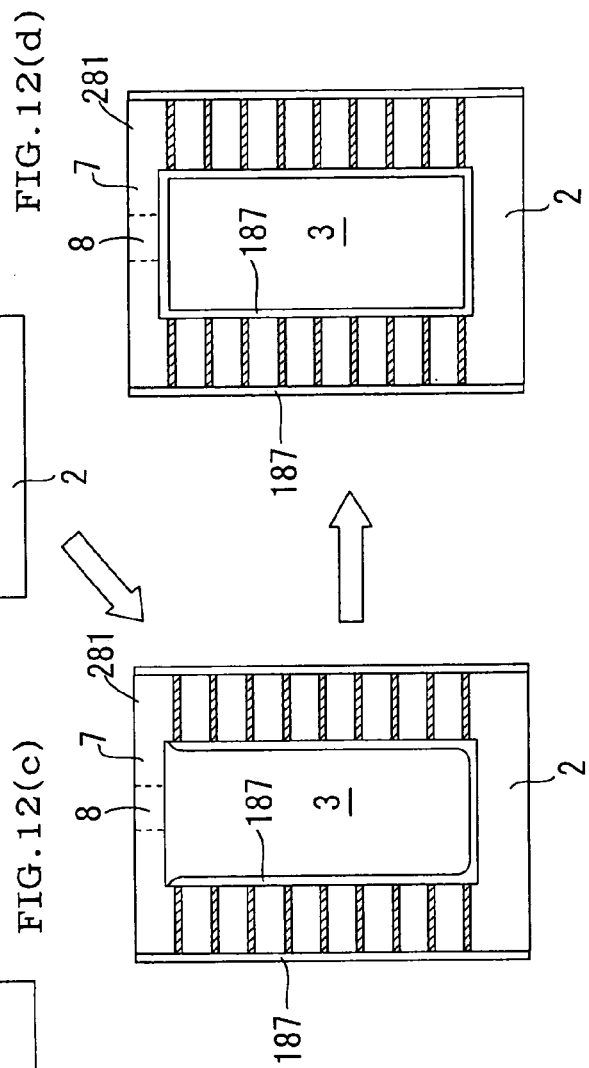

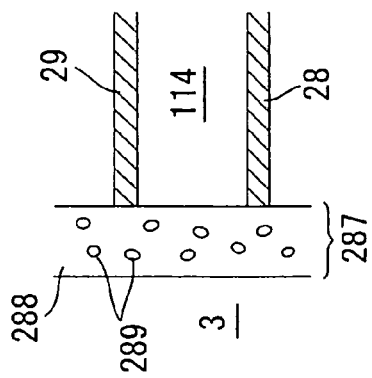
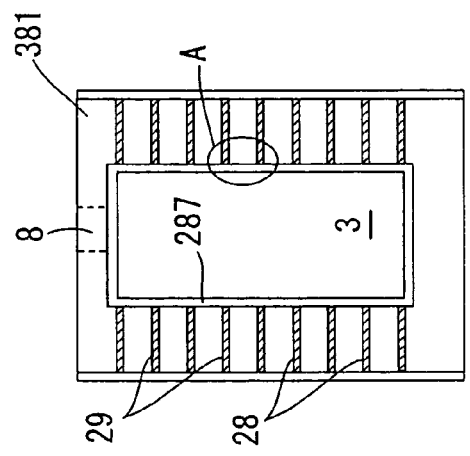
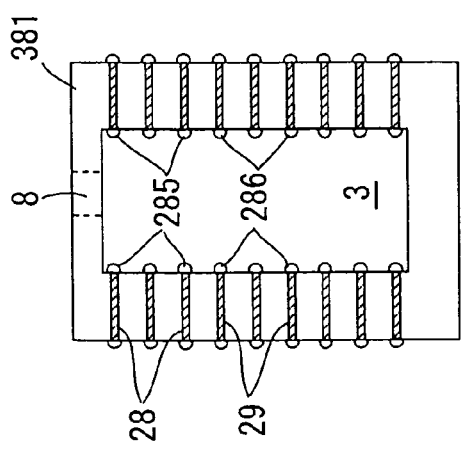
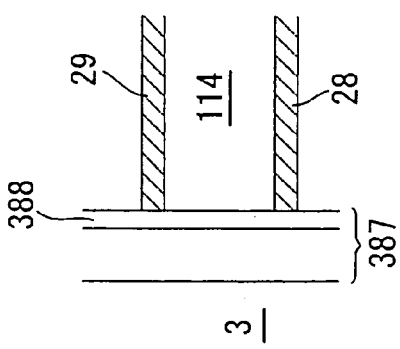
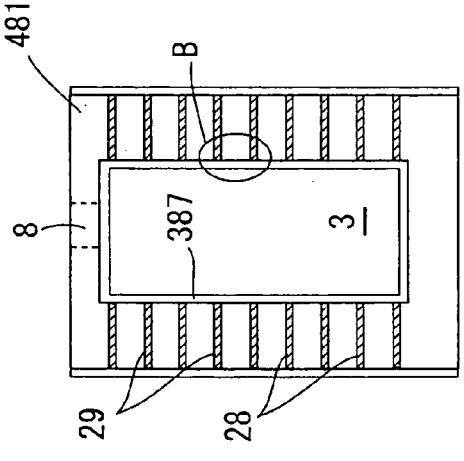
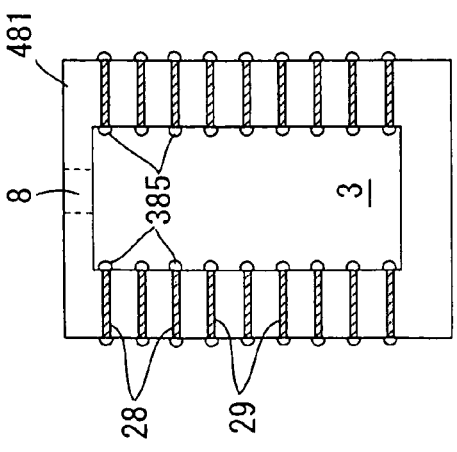

CELL DRIVING TYPE PIEZOELECTRIC/ELECTROSTRICTIVE ACTUATOR AND METHOD OF MANUFACTURING THE SAME

This application claims the benefit of Japanese Application No. 2003-370594, filed Oct. 30, 2003, Japanese Application No. 2004-159779, filed May 28, 2004, and Japanese Application No. 2004-249798, filed Aug. 30, 2004, the entireties of which are incorporated herein by reference.

BACKGROUND OF THE INVENTION

1. Field of the Invention

The present invention relates to a cell driving type piezoelectric/electrostrictive actuator having cells each being defined by wall portions, and capable of achieving a predetermined function due to the volume change of the cell(s) by displacement caused by a piezoelectric operation portion provided on the wall portions.

2. Description of the Related Art

It has passed a long time since an ink jet head was employed for a printer, facsimile machine, copying machine, and other printing apparatuses. In recent years, a non-impact system has been used especially in most of compact size printers, and a clear image has been reproduced on paper by the sophisticated ink let head as in a photograph.

A printing apparatus of the non-impact system means an apparatus for discharging an ink via a nozzle to print some images and/or characters to be printed on a printing medium such as paper. They are classified mainly into a piezoelectric system and a thermal jet system (Bubble Jet (registered trademark), etc.), depending upon type of the ink jet printing head discharging an ink. In these systems, the piezoelectric system denotes a printing apparatus in which a piezoelectric/electrostrictive actuator is used as an ink jet printing head. This ink jet printing head mainly comprises a nozzle, an ink chamber communicating with an ink supply path, and a piezoelectric/electrostrictive device causing a volume change in the ink chamber. In the printing apparatus of the piezoelectric system, the ink jet printing head carries out typing or printing by causing the volume change in the ink chamber while applying a driving voltage to the piezoelectric/electrostrictive device to discharge an ink from the nozzle. Since the ink jet printing head of the piezoelectric system is not required to heat the ink as in the thermal jet system, this type of the printing head has such advantages that freedom in selection of the ink is high, and that the controllability of the printing performance is excellent.

An ink jet (recording) has been disclosed, for example, in Japanese Patent No. 3217006 specification. As shown in FIG. 1 of Japanese Patent No. 3217006 specification, in the proposed ink jet printing head, an electrode coated with a protector film is disposed on the inner surface of a piezoelectric/electrostrictive substrate (plate) to form a groove covered with a lid (top plate) on an upper side. An ink chamber (ink channel) charged with the ink or a dummy chamber (dummy channel) in which any ink is not charged is formed every other groove, and a nozzle plate having a nozzle communicating with the ink chamber is disposed. Opposite side walls of a piezoelectric/electrostrictive body defining the ink chamber (piezoelectric/electrostrictive device in which the electrode is formed) are displaced and deformed to discharge the ink from the nozzle in the ink jet printing head. In the ink jet printing head, the lid has a slit extending through the nozzle plate above the dummy chamber, a depth of the dummy chamber is larger than that of the ink chamber, and the dummy chamber has a depth to such an extent that slip deformation of a bottom part of the dummy chamber is not caused by the deformation of the piezoelectric/electrostrictive side walls constituting the ink chamber. Therefore, crosstalk is reduced, and a stable discharge operation of ink droplets is realized.

However, the above-described conventional ink jet printing heads have been supposed to have several problems. When a conductive liquid is used as an ink in the ink jet printing head, it is indispensable to form the protector film in order to insulate the electrode. Furthermore, depending on a driving polarity, it is necessary to form the protector film in order to prevent electrolysis of the ink regardless of whether or not the ink has conductivity. In the ink jet printing head described in Japanese Patent Registration No. 3217006, after the protector film is formed, the top plate formed of polyimide or the like is bonded with an adhesive. Therefore, when the deformations of the side walls are repeated in a long-term operation, there is a possibility that bonding reliability between the side walls and the top plate drops. Moreover, there is also a possibility that bubbles remain in the ink chamber and discharging defects are caused.

On the other hand when a gap is generated between the side walls and the top plate, the ink remains, and a printing quality drops. In extreme cases, there is a possibility that ink leakage is caused. When the function of the protector film is degraded, there is a possibility that problems such as short circuit and migration occur. The ink jet printing head has been demanded to have a long-period reliability, and it is desirable to thoroughly remove elements resulting in the problems.

SUMMARY OF THE INVENTION

The present invention has been developed in consideration of the above-described problems of the conventional techniques, and an object there of is to provide an actuator preferably for use in an ink jet printing head from which elements resulting in occurrence of problems such as remaining ink, ink leakage, short-circuit on an electrode, and migration are thoroughly removed. As a result of studies, it has been found that the following actuator applied as an ink jet printing head achieves the above-described object.

That is, according to the present invention, there is provided a cell driving type piezoelectric/electrostrictive actuator comprising: one or a plurality of cells defined by a wall portion including side walls, and a ceiling wall and a bottom wall: side walls, and the ceiling wall and the bottom wall being connected to form a space as cell, at least two side walls facing each other comprising piezoelectric/electrostrictive operation portions, the piezoelectric/electrostrictive operation portions being displaced to change a volume of the cell, wherein at least one pore is disposed in the wall portion other than said at least two side walls comprising the piezoelectric/electrostrictive operation portions, and all inner surfaces of the cell being defined by the wall portion are coated with one or more layers of seamless thin films (sometimes hereinafter referred to as a first cell driving type piezoelectric/electrostrictive actuator).

In the present specification, the cell means a sealed small space excluding the pores disposed in the wall portion. The cell inner surface is the surface of the wall portion defining the cell which is a space, and the surface contacts the cell. A cell outer surface is the surface of the wall portion defining the cell which is the space, and the surface does not contact the cell (sometimes contacts a dummy cell).

In the first cell driving type piezoelectric/electrostrictive actuator according to the present invention, at least one pore may be disposed in the wall portion other than said at least two side walls facing each other and comprising the piezoelectric/electrostrictive operation portions, and the actuator may have one or two pores being preferably disposed in either one of the ceiling wall and the bottom wall, and as a size of the pore, a diameter is preferably 200 μm or less, more preferably 20 to 150 μm. However, the present actuator is not limited to those embodiments in any means. The shape of the pore may be preferably circular, but is not limited thereto. In the present specification, the term "the diameter of the pore" means the diameter, when the shape thereof is circular, and it means the diameter of an inscribed circle in a case where the pore is not circular.

In the first cell driving type piezoelectric/electrostrictive actuator according to the present invention, the seamless thin film of one or more layers comprises a single-layer film or a two-layer or multi-layer film being made of a film(s) selected from the group consisting of a barrier film, an electrode film, an insulating film, a protector film, and a moistureproof film.

Moreover, in the first cell driving type piezoelectric/electrostrictive actuator according to the present invention, the seamless thin film of one or more layers comprises a multi-layer film including a barrier film and an electrode film, and at least the barrier film, and the electrode film are preferably layered in this order from the inner surface of the wall portion.

Furthermore, in the first cell driving type piezoelectric/electrostrictive actuator according to the present invention, the seamless thin film of one or more layers comprises a two-layer or multi-layer film including at least one electrode film, and further including one or more films being made of a film(s) selected from the group consisting of an insulating film, a protector film, and a moistureproof film, and at least the electrode film and the insulating film, at least the electrode film and the protector film, or at least the electrode film and the moistureproof film are preferably layered in this order from the inner surface of the wall portion.

In the first cell driving type piezoelectric/electrostrictive actuator according to the present invention, the electrode film is formed of a metal or an oxide thereof in a case where the seamless thin film of one or more layers includes the electrode film.

Moreover, the barrier film is preferably formed of an oxide or a nitride in a case where the seamless thin film of one or more layers includes the barrier film.

Furthermore, the insulating film, the protector film, and the moistureproof film are formed of oxides, nitrides, or carbides in a case where the seamless thin film of one or more layers includes the insulating film, the protector film, and the moistureproof film.

In the first cell driving type piezoelectric/electrostrictive actuator according to the present invention, the wall portion including side walls, the ceiling wall, and the bottom wall is preferably integrally fired.

In the first cell driving type piezoelectric/electrostrictive actuator according to the present invention, one may call its piezoelectric/electrostrictive operation portion which causes displacement as a piezoelectric/electrostrictive device since it comprises a piezoelectric/electrostrictive body and at least a pair of driving electrodes, but it is often referred to as a piezoelectric/electrostrictive operation portion constituting at least two side walls in the wall portion defining the cell.

A mode of the piezoelectric/electrostrictive operation portion is not limited, but each of the piezoelectric/electrostrictive operation portions constituting two side walls has layered piezoelectric/electrostrictive bodies and at least a pair of driving electrodes alternately stacked in a height direction of the side wall, and the displacement is preferably generated by a vertical effect of an electric field induced strain.

In this mode, the number of the layered piezoelectric/electrostrictive bodies is not limited, and one or a plurality of bodies may be disposed. A minimum constitution of the piezoelectric/electrostrictive operation portion is a mode in which a pair of driving electrodes are formed via one layer of the piezoelectric/electrostrictive body, but the piezoelectric/electrostrictive body is preferably thinner and multilayered in order to enhance a displacement efficiency. The layered piezoelectric/electrostrictive bodies are referred to as layered piezoelectric/electrostrictive bony in contrast to a platy piezoelectric/electrostrictive body, but the terms "layered" and "platy" do not limit the thickness of the piezoelectric/electrostrictive body. An expression "the height direction of the side wall" refers to a relative height direction in contrast to a width direction of the side wall, and the terms "height" and "width" do not indicate an absolute direction. That is, a direction opposite to a gravity direction is not necessarily the height direction.

Moreover, in the first cell driving type piezoelectric/electrostrictive actuator according to the present invention, each of the piezoelectric/electrostrictive operation portions constituting two side walls has platy piezoelectric/electrostrictive bodies and at least a pair of driving electrodes alternately stacked in a width direction of the side wall, and the displacement is preferably generated by a transverse effect of an electric field induced strain. Since the driving electrode is stacked on the piezoelectric/electrostrictive body in the width direction to constitute the side wall, the driving electrode appearing in an outermost layer of the stacked layers sometimes corresponds to the cell inner surface (and the cell outer surface). In this case, the driving electrode is formed as the seamless electrode film in at least the cell inner surface.

Moreover, in this mode, the number of the platy piezoelectric/electrostrictive bodies per wall portion is not limited, and one or a plurality of bodies may be disposed. A minimum constitution of the piezoelectric/electrostrictive operation portion is a mode in which a pair of driving electrodes is formed, by sandwiching a piezoelectric/electrostrictive body, on both side surfaces thereof. When the plurality of piezoelectric/electrostrictive bodies are disposed, the bodies are stacked in the width direction of the side wall, and electrodes are also formed on the surfaces between the piezoelectric/electrostrictive bodies. As described above, this is referred to as the platy piezoelectric/electrostrictive body but the thickness of the piezoelectric/electrostrictive body is not limited. Although the thickness is not limited, a plurality of platy piezoelectric/electrostrictive bodies are preferably disposed. This is because a displacement efficiency is enhanced. When the plurality of platy piezoelectric/electrostrictive bodies are disposed, the driving electrodes are formed on the side surfaces of the respective piezoelectric/electrostrictive bodies, and also on the surfaces between the piezoelectric/electrostrictive bodies. Therefore, the piezoelectric/electrostrictive bodies and at least a pair of driving electrodes is alternately stacked in the width direction of the side wall.

It is to be noted that the vertical effect of the electric field induced strain refers to deformation of the piezoelectric/electrostrictive operation portion (piezoelectric/electrostrictive body) which expands/contracts in the same direction, when an electric field is applied in a polarization direction. The transverse effect of the electric field induced strain refers to the deformation of the piezoelectric/electrostrictive operation portion (piezoelectric/electrostrictive body) which expands/contracts in a vertical direction, when the electric field is applied in the polarization direction.

In the first cell driving type piezoelectric/electrostrictive actuator according to the present invention, at least two side walls which face each other may comprise the piezoelectric/electrostrictive operation portions, the remaining side walls, the ceiling wall and the bottom wall which constitute a remaining wall portion constituting the cell may not be deformed, but one or both of the ceiling wall and the bottom wall may comprise the piezoelectric/electrostrictive operation portion.

The first cell driving type piezoelectric/electrostrictive actuator according to the present invention is referred to as a piezoelectric/electrostrictive actuator. The actuator uses strain induced by the electric field, and is not limited to an actuator using a piezoelectric effect which generates a strain substantially proportional to the applied electric field or an actuator using an electrostrictive effect which generates a strain substantially proportional to a square of the applied electric field in a narrow sense. Actuators utilizing phenomena such as polarization reversal seen in a general ferroelectric material, and antiferroelectric phase-ferroelectric phase transition seen in an antiferroelectric material are also included. In the cell driving type piezoelectric/electrostrictive actuator according to the present invention, a ceramic actuator superior in material strength is more preferable. It is appropriately determined whether or not to perform a process concerning polarization based on properties of the piezoelectric/electrostrictive material for use in the piezoelectric/electrostrictive body of the piezoelectric/electrostrictive operation portion constituting the piezoelectric/electrostrictive actuator according to the present invention.

Moreover, in the first cell driving type piezoelectric/electrostrictive actuator according to the present invention, and the side walls, the ceiling wall, and the bottom wall may comprise curved surfaces, not flat surfaces, to form various cell shapes. A more preferable shape of the cell is a square rod shape having a small width relative to the height in a section in a longitudinal direction, that is, a slit shape. That is, the slit-shaped cell means that at least two side walls which face each other are comparatively long, and the remaining side walls, the ceiling and bottom walls are short among the constituting elements of the wall portion defining the cell. More concretely, a ratio (referred to as an aspect ratio of the cell) of a shortest distance (referred to as a cell height) between the bottom and ceiling walls with respect to a shortest distance (referred to as a cell width) between at least two side walls constituting the piezo-electric/electrostrictive operation portion forming one cell is preferably approximately 2 to 100. The cell width is preferably approximately 60 μm or less. More preferably, the aspect ratio of the cell is 10 to 40, and the cell width is 50 μm or less.

Furthermore, in the first cell driving type piezoelectric/electrostrictive actuator according to the present invention, a ratio (referred to as an aspect ratio of the side wall (piezoelectric/electrostrictive operation portion)) of the height (equal to the cell height) of the side wall to the thickness of the side wall (piezoelectric/electrostrictive operation portion) is preferably approximately 2 to 100. More preferably, the aspect ratio of the side wall is approximately 10 to 50. Any actuator that satisfies at least one of the above-mentioned requirements, further preferably all of them, may easily achieve a higher output, and a high integration, and accordingly it is possible to realize a further compact actuator.

In the present specification, the term "wall portion" is used together with adjective expression "side", "ceiling", or "bottom", but this expression does not mean the absolute direction or the positional relation. That is, the wall portion positioned in the gravity direction is not necessarily called as a bottom wall. Moreover, the expression "the side wall comprises the piezoelectric/electrostrictive operation portion" is often used in the present specification, and this includes a case where a part of at least two side walls facing each other comprise the piezoelectric/electrostrictive operation portion, and more preferably the whole portion of the side walls may constitute the piezoelectric/electrostrictive operation portion.

Any of the above-described cell driving type piezoelectric/electrostrictive actuators is applicable to a liquid discharge device. According to the present invention, there is provided a liquid discharge device using any of the above-described cell driving type piezoelectric/electrostrictive actuators.

A liquid discharge device using the cell driving type piezoelectric/electrostrictive actuator is a liquid discharge device in which a cell constitutes a liquid pressurizing chamber and which is capable of discharging a liquid charged in the cell and containing particles by a change of a volume of the cell by displacement of a piezoelectric/electrostrictive operation portion, wherein a surface potential of an outermost layer facing a cell inner surface among one or more layers of seamless thin films with which all cell inner surfaces of a wall portion are coated preferably has the same polarity as that of the surface potential of the particles contained in the liquid.

For example, in an ink jet printer among the liquid discharge devices, in recent years, a pigment-based ink has been frequently used in order to prolong a life of a printed matter. Moreover, the pigment-based ink is a liquid containing pigment particles for coloration. The surface potential of the pigment particles contained in the liquid is set to have the same polarity as that of the surface potential of the cell inner wall surface, accordingly the pigment particles and the cell inner wall surface repel each other, the pigment particles are inhibited from being chemically adsorbed by the wall portion, and a stable discharge function can be maintained. Even in a device for discharging an ionized solution or the like among the liquid discharge devices, chemical adsorption can be reduced by a similar principle, and cleanability of the device can be rapidly enhanced. A micro-amount liquid discharge device applied to a biomedical field needs to handle various liquids, and a quality of the cleanability of the device is an important problem. It is to be noted that the surface potential can be grasped by measurement of a zeta potential. When physical properties of the liquid are grasped beforehand, a device design is possible in which a discharge function is optimized.

Next, according to the present invention, there is provided a method of manufacturing a cell driving type piezoelectric/electrostrictive actuator comprising: one or a plurality of cells each defined by a wall portion including side walls, a ceiling wall, and a bottom wall: side walls, the ceiling wall and the bottom wall being connected to form a space as cell, at least two side walls facing each other comprising piezoelectric/electrostrictive operation portions, wherein at least one pore is disposed in the wall portion other than said at least two side walls comprising the piezoelectric/electrostrictive operation portions, and all inner surfaces of the wall portion defining the cell are coated with one or more layers of seamless thin films, the method comprising the steps of:

preparing at least two side walls facing each other of a wall portion including a piezoelectric/electrostrictive body, forming at least one pore in the wall portion other than said at least two side walls comprising the piezoelectric/electrostrictive operation portions to form the cell, introducing a film forming material into each cell through said at least one pore formed, and forming at least one of seamless thin films so as to coat all the inner surfaces of the wall portion defining each cell by a predetermined film forming means (sometimes referred to as a first method of manufacturing the cell driving type piezoelectric/electrostrictive actuator, or simply as a first manufacturing method). In this method, a timing for forming a driving electrode on two side walls comprising the piezoelectric/electrostrictive body in order to finally constitute at least two side walls facing each other by the piezoelectric/electrostrictive operation portion is not limited. A preferable timing for forming the driving electrode sometimes differs depending on whether or not the piezoelectric/electrostrictive operation portion constituting at least two side walls causes a displacement by a vertical effect of an electric field induced strain or by a transverse effect of the electric field induced strain, and therefore the electrode may be formed at an appropriate timing.

In the first method of manufacturing the cell driving type piezoelectric/electrostrictive actuator, the film forming material is preferably a gaseous material. Moreover, in this case, the film forming means is preferably either one of a CVD process and an evaporation polymerization process.

Moreover, in the first method of manufacturing the cell driving type piezoelectric/electrostrictive actuator, the film forming material is preferably a liquid material. In this case, the film forming means is preferably a plating process.

Furthermore, the first method of manufacturing the cell driving type piezoelectric/electrostrictive actuator preferably comprises the steps of: exposing an electrode on the cell inner surface of the wall portion at time of forming the cell; introducing a liquid film forming material into the cell through at least one pore to deposit the material on at least the electrode using an electrophoresis process as the film forming means; and performing a thermal treatment at a temperature which is not less than a softening temperature of the film forming material.

In this case, the thermal treatment is preferably performed twice or more times. It is to be noted that one thermal treatment refers to a treatment capable of fluidizing the film forming material, and a division of the thermal treatment is indicated by performing cooling. The electrode corresponds to the driving electrode, but may be an electrode film-formed on the cell inner surface beforehand by another film forming means.

Moreover, in this case (in the step of performing the thermal treatment using the electrophoresis process as the film forming means), two or more types of film forming materials are used, two or more types of the film forming materials are mixed by the thermal treatment to obtain a complex material, and the seamless thin film is preferably formed by the complex material.

For example, when an inorganic material is used as the film forming material, two or more materials are used and composited, and accordingly it is possible to match a coefficient of thermal expansion of the thin film with that of a wall portion (substrate). More concretely, when lead zirconate titanate (PZT) is used as the material of the wall portion, the coefficient of thermal expansion of PZT is $3 \times 10^{-6}$/K, and it is difficult to select a glass powder as the film forming material in accordance with the coefficient of thermal expansion. The temperature of the thermal treatment for fluidizing the film forming material is preferably lowered from a viewpoint of diffusion prevention, and is demanded to be concretely 500 to 600° C. It is difficult to prepare the glass powder which can be thermally treated at such a low temperature (whose glass transition point is low) and which has a low coefficient of thermal expansion. The coefficient of thermal expansion of a usual material having a low glass transition temperature is about 5 to $7 \times 10^{-6}$/K. Therefore, when silica having a very small coefficient of thermal expansion ($0.5 \times 10^{-6}$/K) is dispersed in the glass powder to prepare the material, a glass insulating film matching PZT constituting the wall portion can be prepared.

Moreover, when an organic material is used as the film forming material, for example, an acrylic resin and an epoxy-based resin can be composited. When the epoxy-based resin superior in insulation and anticorrosion and the acrylic resin superior in adhesion to the wall portion (substrate) are hybridized, a superior thin film can be formed.

Furthermore, when the method has a step of performing the thermal treatment using the electrophoresis process as the film forming means, components of the film forming material are preferably allowed to react with those of the materials constituting the wall portion to form a layer of the reaction product between the seamless thin film and the wall portion. In the present specification, a layer of such reaction product is hereinafter called merely as a reaction layer. For example, the reaction layer can be formed at the time of the thermal treatment as follows: in the case that the wall portion (substrate) is formed of a material containing Pb components such as lead zirconate titanate (PZT), a silicon (Si)-containing material is selected as the film forming material, the component (Pb) of the film forming material would react with the component (Si) of the material constituting the wall portion to form the reaction layer at the time of subjecting the film to the thermal treatment for the fixation. Accordingly, the adhesion of the thin film to the wall portion can be remarkably strengthened due to thus formed reaction layer.

Moreover, according to the present invention, there is provided a method of manufacturing a cell driving type piezoelectric/electrostrictive actuator comprising: one or a plurality of cells each defined by a wall portion comprising side walls inclusive of at least two side walls facing each other and comprising piezoelectric/electrostrictive operation portions, a ceiling wall and a bottom wall: side walls, the ceiling wall and the bottom wall being connected to form a space as cell, wherein at least one pore is disposed in the wall portion other than said two side walls comprising the piezoelectric/electrostrictive operation portions, and all inner surfaces of the wall portion defining each cell are coated with one or more layers of seamless thin films, the method comprising the steps of:

preparing at least two side walls facing each other of the wall portion using a material for a piezoelectric/electrostrictive operation portions to form a cell together with remaining walls, and disposing at least one pore in the wall portion other than said at least two side walls comprising the piezoelectric/electrostrictive operation portions, and setting the cell to be drivable as an actuator; and driving the piezoelectric/electrostrictive operation portions constituting the side walls to change a volume of the cell so as to introduce a film forming material into the cell through said at least one pore, and forming a seamless thin film so as to coat all inner surfaces of the wall portion defining each cell by predetermined film forming means (sometimes referred to as the second method of manufacturing the cell driving type piezoelectric/electrostrictive actuator, or simply as the second manufacturing method). In this method, unlike the first manufacturing method, the cell needs to be set to be drivable as the actuator before forming the seamless thin film for coating the whole cell inner surface on the cell inner surface of the wall portion. Therefore, when at least the cell is formed, at least two side walls which face each other have to comprise the piezoelectric/electrostrictive operation portions. That is, when the cell is formed, at least two side walls which face each other need to comprise piezoelectric/electrostrictive bodies and a driving electrode needs to be formed. Additionally, it is not limited whether or not the piezoelectric/electrostrictive operation portions constituting at least two side walls cause the displacement by the vertical effect or the transverse effect of the electric field induced strain, and either effect may be used.

In the first and second manufacturing methods of the cell driving type piezoelectric/electrostrictive actuator, (both the methods may be referred to simply as the method of manufacturing the cell driving type piezoelectric/electrostrictive actuator according to the present invention), a diameter of the pore is preferably 200 μm or less, more preferably 20 to 150 μm. It is to be noted that one or more pores may be disposed in the wall portion other than said at least two side walls comprising the piezoelectric/electrostrictive operation portions, this is not limited, and one or two pores are more preferably disposed in one of the ceiling wall and the bottom wall.

Moreover, in the method of manufacturing the cell driving type piezoelectric/electrostrictive actuator according to the present invention, at least two side walls may comprise the piezoelectric/electrostrictive bodies, and the ceiling wall and the bottom wall may comprise the piezoelectric/electrostrictive body, or may be formed of another material. More preferably, in order to form at least two side walls by the piezoelectric/electrostrictive bodies, when preparing at least two side walls and the bottom wall in the wall portion defining the cell, a green sheet stacking process is used having the steps of: processing holes in a plurality of ceramic green sheets containing a piezoelectric/electrostrictive material as a main component; stacking the sheets; and integrally firing the sheets. In this method, the ceiling wall is separately prepared, and attached later. More preferably, when a green sheet stacking process is employed at time of preparing at least two side walls and the bottom wall in the wall portion defining each cell, said stacking method may comprise the steps of processing holes in a plurality of ceramic green sheets containing a piezoelectric/electrostrictive material as a main component; stacking said plurality of the sheets; and integrally firing thus stacked sheets. In this method, all the constitutional walls of the wall portion defining the cell are integrated.

In the method of manufacturing the cell driving type piezoelectric/electrostrictive actuator according to the present invention, the pores preferably serve also as nozzles for discharging a liquid in a case where the actuator which is a manufacturing object is used in a liquid discharge device. One example of the liquid discharge device is an ink jet printing head.

In the method of manufacturing the cell driving type piezoelectric/electrostrictive actuator according to the present invention, means or steps for forming at least one pore in the wall portion other than said at least two side walls comprising the piezoelectric/electrostrictive operation portions are not limited, and said at least one pore may be formed in any method before introducing the film forming material into the cell.

Next, according to the present invention, there is provided a cell driving type piezoelectric/electrostrictive actuator comprising: one or a plurality of cells defined by a wall portion including side walls, a ceiling wall and a bottom wall: side walls, the ceiling wall and the bottom wall being connected to form a space as cell, at least two side walls facing each other comprising piezoelectric/electrostrictive operation portions, the piezoelectric/electrostrictive operation portions being displaced to change a volume of the cell, wherein at least one pore is disposed in the wall portion other than said two side walls facing each other and comprising the piezoelectric/electrostrictive operation portions, and wherein inner surfaces of side walls, and inner surfaces of connection portions of side walls, the ceiling wall and the bottom wall are coated with one or more layers of seamless thin films, thereby connection reliabilities of side walls, the ceiling wall and the bottom wall are enhanced (sometimes hereinafter referred to as a second cell driving type piezoelectric/electrostrictive actuator).

It is to be noted that in the present specification, the cell driving type piezoelectric/electrostrictive actuator according to the present invention refers to the first cell driving type piezoelectric/electrostrictive actuator.

In the cell driving type piezoelectric/electrostrictive actuator according to the present invention, one or more layers of the seamless thin films for coating the whole cell inner surface are formed on the cell inner surface of the wall portion defining the cell. The thin film is seamless, and therefore is not easily destroyed, the inside and the outside of the cell which communicate with each other via the pores are completely partitioned other than pore portions, and isolating properties are enhanced. A portion constituting a reservoir portion of a fluid is not easily formed in the cell inner surface. Furthermore, since the thin film is formed on the cell inner surface, that is, the surface of the wall portion defining the cell that is a space and contacting the cell (space). Therefore, constituting elements of the wall portion can be directly bonded without disposing any adhesive portion among the constituting elements (e.g., between the side walls and the ceiling wall (or the bottom wall) as in a conventional technique. Therefore, even when the constituting elements of the wall portion are bonded with an adhesive, high bonding reliability between the constituting elements of the wall portion can be kept against the deformation of the side wall repeated by a long-period operation. Additionally, a possibility that the thin film is destroyed or at least a function originally held by the film drops is small.

In a preferable mode of the cell driving type piezoelectric/electrostrictive actuator according to the present invention, the wall portions are fired/integrated. Since any adhesive is not used in bonding the constituting elements of the wall portion in this mode, a mechanical strength of the wall portion defining the cell increases, and a drop of bonding reliability between the constituting elements of the wall portion, caused by the adhesive, can be completely eliminated. Since any interface does not appear the wall portion contacting the thin film, the adhesion between the wall portion and the thin film is enhanced, influences (chemical change, physical stress) on the seamless thin film in the long-period use are further reduced, and degradation of the thin film is inhibited.

Therefore, when the cell driving type piezoelectric/electrostrictive actuator according to the present invention is applied as an ink jet printing head, ink does not easily remain in the cell, and there is hardly a possibility that ink leakage is caused. A trouble such as a drop of a printing quality is not easily caused, and problems such as short-circuit and migration are controlled. That is, the ink jet printing head using the cell driving type piezoelectric/electrostrictive actuator according to the present invention has a superior long-period reliability.

BRIEF DESCRIPTION OF THE DRAWINGS

FIGS. 10(a) to 10(c) are explanatory views showing one example of schematic steps of a first method of manufacturing the cell driving type piezoelectric/electrostrictive actuator according to the present invention;

FIGS. 12(a) to 12(d) are explanatory views of the film forming steps by the electrophoresis process;

FIGS. 14(a) to 14(c) are explanatory views of the film forming steps by the electrophoresis process;

FIGS. 15(a) to 15(c) are explanatory views of the film forming steps by the electrophoresis process;

DESCRIPTION OF THE PREFERRED EMBODIMENT

Figure 1A:
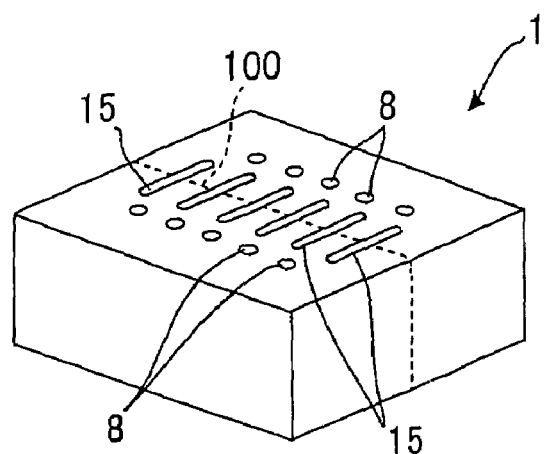
FIG. 1(a) is a perspective view showing one embodiment of a first cell driving type piezoelectric/electrostrictive actuator according to the present invention.

Embodiments of a cell driving type piezoelectric/electrostrictive actuator of the present invention, and a method of manufacturing the actuator will be described hereinafter appropriately with reference to the drawings, but the present invention is not interpreted, with limiting to these embodiments. Various changes, modifications, improvement, or replacements may be made based on knowledge of a person skilled in the art without departing from the sprit of the present invention. For example, the accompanying drawings show preferable embodiments of the present invention, therefore, the present invention is not limited to embodiments or information shown in the drawings. In implementing or verifying the present invention, means similar or equivalent to the means described in the present specification is applicable. Indeed, the means described hereinafter shows a preferable means.

Figure 1B:
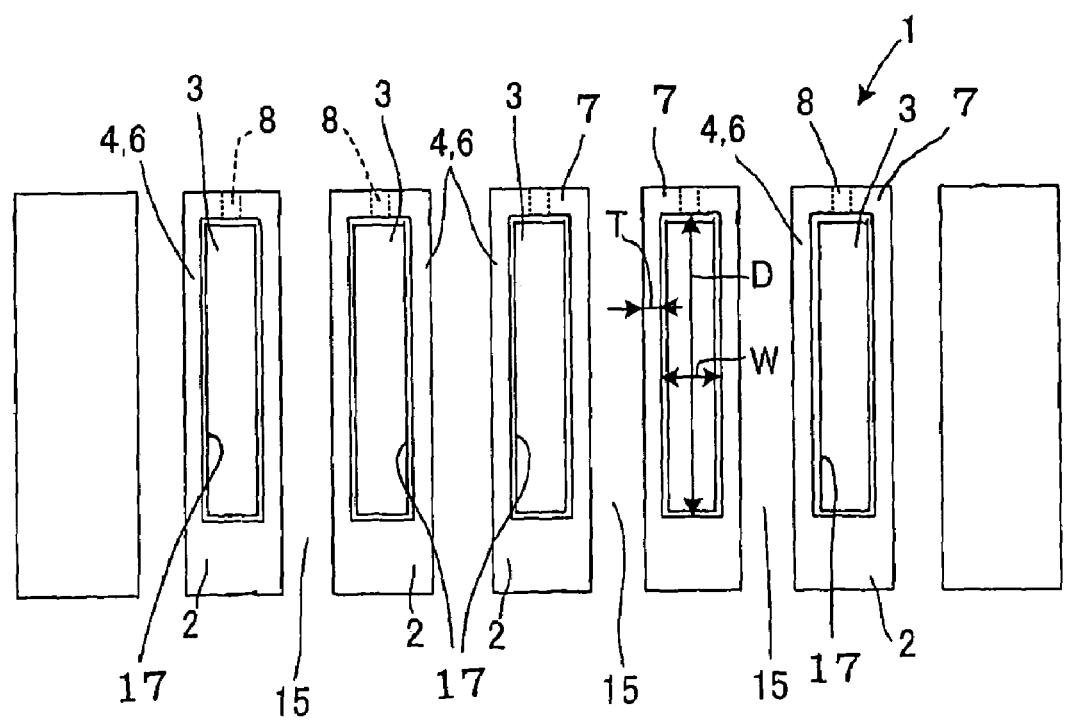
FIG. 1(b) is a cross-sectional view in a case where the cell driving type piezoelectric/electrostrictive actuator shown in FIG. 1(a) is cut along a cutting line.

First, a cell driving type piezoelectric/electrostrictive actuator according to the present invention will be described. FIG. 1(a) is a perspective view showing one embodiment of the cell driving type piezoelectric/electrostrictive actuator according to the present invention, and FIG. 1(b) is a cross-sectional view in a case where a cell driving type piezoelectric/electrostrictive actuator 1 shown in FIG. 1(a) is cut along a cutting line 100. In the cell driving type piezoelectric/electrostrictive actuator 1 shown in FIGS. 1(a), 1(b), each cell 3 has two pores 8 usable as nozzles in a shown upper surface, and the actuator is usable in an ink jet printing head of a printing apparatus of a piezoelectric/electrostrictive system or various liquid discharge devices.

The cell driving type piezoelectric/electrostrictive actuator 1 comprises a plurality of cells 3 each having a wall portion including at least two side walls which face each other 6, and a ceiling wall 7 and a bottom wall 2 connected to the two side walls 6, and each having a substantially slit-shaped rectangular parallelepiped shape formed by the wall portion. Two pores 8 extend through the cell 3, and open in the ceiling wall 7. In each cell 3, at least two side walls 6 are constituted as piezoelectric/electrostrictive operation portions 4, and a volume of the cell 3 changes by displacement of the piezoelectric/electrostrictive operation portion 4. Spaces among the plurality of cells 3 are constituted as dummy cells 15, and one cell 3 is completely independent of the other cell 3.

In the cell driving type piezoelectric/electrostrictive actuator according to the present invention, an aspect ratio of the cell is determined for each cell, and an aspect ratio of the side wall is determined for each side wall. In the cell driving type piezoelectric/electrostrictive actuator 1 shown in FIG. 1(b), the aspect ratio of the side wall 6 (piezoelectric/electrostrictive operation portion 4) is represented by a thickness T and a height (corresponding to a depth D of the cell) (=D/T), and is approximately 15. The aspect ratio (=D/W) of the cell indicated by a width W of the cell and the depth D (corresponding to the height of the side wall) of the cell is about 5.

As shown in FIG. 1(b), a seamless thin film 17 which coats a whole cell inner surface is formed on the cell inner surface of the wall portion (surface contacting the cell 3 which is a space among the surfaces of the wall portion defining the cell 3). Moreover, the wall portion is formed by firing/integrating all constituting elements including two side walls 6, the ceiling wall 7, and the bottom wall 2, any bonded portion by an adhesive exists in the wall portion, and the wall portion can also be seamless. That is, the cell 3 which is the space is formed by double seamless partitioning means: the thin film 17 for surrounding the cell other than a pore 8 portion; and the wall portion surrounding the outside of the cell. The only surface of the continuous thin film 17 exists as viewed from the inside of the cell 3, and any portion constituting reservoir of a fluid is not seen. There is hardly a possibility that the thin film is destroyed.

It is to be noted that the fired/integrated wall portion is not an essential requirement of the cell driving type piezoelectric/electrostrictive actuator according to the present invention, but is a preferable mode. When the cell driving type piezoelectric/electrostrictive actuator 1 is applied as an ink jet printing head, the cell 3 constitutes an ink chamber (liquid pressurizing chamber), the piezoelectric/electrostrictive operation portion 4 (side wall 6) contracts/expands (in a vertical direction in FIG. 1(*b*), a volume of the cell 3 is changed, and the ink (liquid) charged in the cell 3 can be discharged.

In the cell driving type piezoelectric/electrostrictive actuator 1, the pore 8 opens in the ceiling wall 7, but the cell driving type piezoelectric/electrostrictive actuator according to the present invention is not limited as long as at least one pore is formed in a wall portion other than at least two side walls facing each other and comprising the piezoelectric/electrostrictive operation portions. When the cell has a slit-like rectangular parallelepiped shape in the same manner as in the cell driving type piezoelectric/electrostrictive actuator 1, the side wall in a short direction exists as the constituting element of the wall portion, and at least one pore may be formed in the side wall of the short direction, or in the bottom wall.

Figure 16:
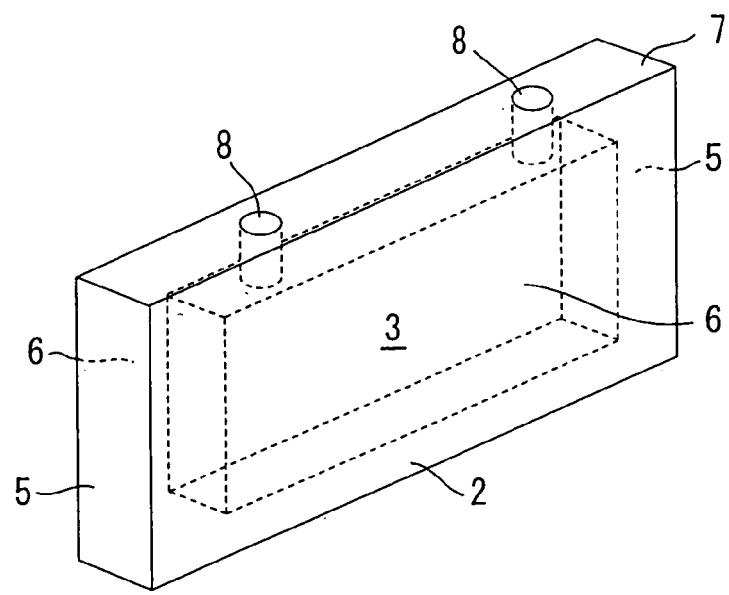
FIG. 16 is a perspective view showing a cell and a wall portion defining the cell only in one embodiment of the first cell driving type piezoelectric/electrostrictive actuator according to the present invention.
Figure 17:
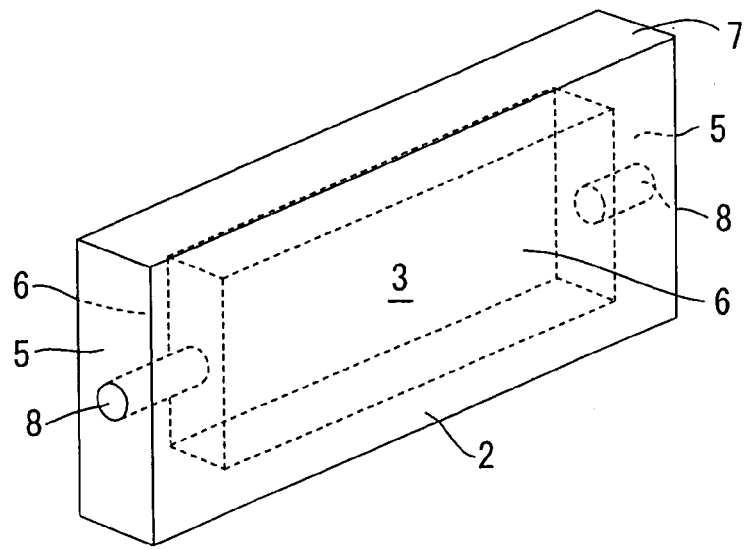
FIG. 17 is a perspective view showing the cell and the wall portion defining the cell only in one embodiment of the first cell driving type piezoelectric/electrostrictive actuator according to the present invention.

FIG. 16 is a perspective view showing one cell 3 and the wall portion defining the cell only in the cell driving type piezoelectric/electrostrictive actuator 1 shown in FIG. 1(*b*). As shown, the wall portion defining the cell 3 having the slit-like rectangular parallelepiped shape is formed by two side walls 5 which are side walls in a short direction in addition to two side walls 6 in a longitudinal direction, the ceiling wall 7, and the bottom wall 2, and the pores 8 open in the ceiling wall 7. On the other hand, in a cell driving type piezoelectric/electrostrictive actuator shown in FIG. 17, the wall portion defining the cell 3 having the slit-like rectangular parallelepiped shape is similarly formed by two side walls 5 which are the side walls in the short direction in addition to two side walls 6 in the longitudinal direction, the ceiling wall 7, and the bottom wall 2, and the pores 8 open in the side walls 5 in the short direction.

Figure 18:
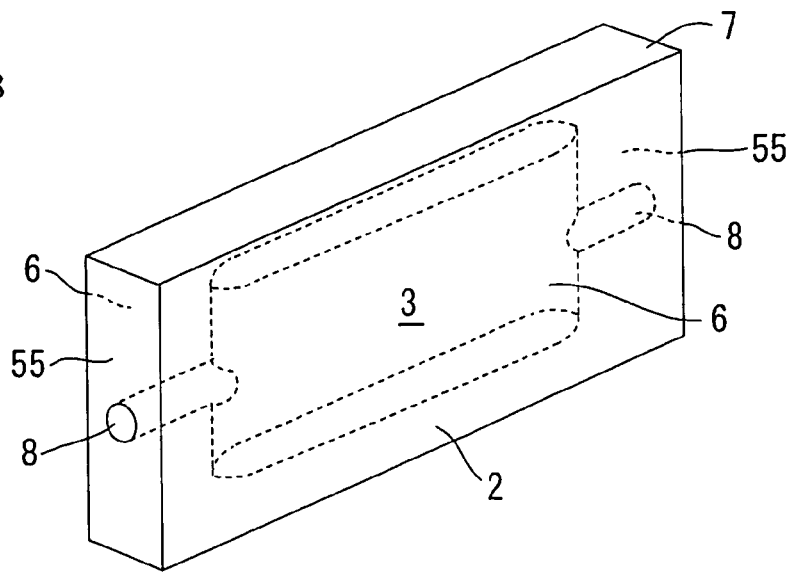
FIG. 18 is a perspective view showing the cell and the wall portion defining the cell only in one embodiment of the first cell driving type piezoelectric/electrostrictive actuator according to the present invention.

Additionally, in the cell driving type piezoelectric/electrostrictive actuator according to the present invention, the cell is formed by the wall portion including side walls, the ceiling wall, and the bottom wall, the cell is a sealed space excluding the pores, but the cell is not limited to the above-described rectangular parallelepiped shape. FIG. 18 is a perspective view showing one cell and the wall portion defining the cell only in an embodiment in which the cell does not have the rectangular parallelepiped shape. To obtain a cell which is a sealed space except for the pores even in the cell having a boat shape as shown, side walls 55 exist which are not flat walls like the side walls 5 in the short direction in the cell driving type piezoelectric/electrostrictive actuator shown in FIG. 17 but which correspond to the side walls 5. Moreover, the mode of this portion is changeable depending on the cell. Therefore, the cell driving type piezoelectric/electrostrictive actuator according to the present invention is specified by a mode in which each cell is a sealed space excluding the pores and the cell is formed by the wall portion including two side walls, and the ceiling wall and the bottom wall connected to the two side walls. It is to be noted that in the present specification, the side wall simply refers to the side wall in the longitudinal direction comprising the piezoelectric/electrostrictive operation portion.

In FIG. 1(*b*), any concrete mode of the piezoelectric/electrostrictive operation portion 4 of the cell driving type piezoelectric/electrostrictive actuator 1 is not shown. The cell driving type piezoelectric/electrostrictive actuator according to the present invention comprises piezoelectric/electrostrictive bodies in which the piezoelectric/electrostrictive operation portions cause the displacement, and at least a pair of driving electrodes, but the concrete mode is not limited, and the piezoelectric/electrostrictive operation portion has various modes. For example, the portion can be classified by a stacking mode of the piezoelectric/electrostrictive bodies, or forming modes of the driving electrodes for applying electric fields to the piezoelectric/electrostrictive bodies in such a manner that the bodies function as the piezoelectric/electrostrictive operation portions causing the displacement. One or more layers of the seamless thin films can have various modes comprising one single-layer film or double-layer or multi-layer films comprising, for example, an electrode film, an insulating film, a protector film, a moistureproof film or the like in accordance with the mode of the piezoelectric/electrostrictive operation portion, or properties of a fluid charged in the cell and contacting the thin film.

The cell driving type piezoelectric/electrostrictive actuator showing concrete mode of the piezoelectric/electrostrictive operation portion and the thin film will be described hereinafter with reference to FIGS. 2 to 7. Each of FIGS. 2 to 7 shows one cell and the wall portion defining the cell only, but each of the actuators comprises a plurality of cells. A whole constitution of the cell driving type piezoelectric/electrostrictive actuator shown in FIGS. 2 to 7 as an actuator including pores, dummy cells and the like conforms to the cell driving type piezoelectric/electrostrictive actuator 1 shown in FIGS. 1(*a*), 1(*b*).

Each of cell driving type piezoelectric/electrostrictive actuators 110, 130, 140, 12.0 shown in FIGS. 2, 3, 4, 5 has a mode in which the piezoelectric/electrostrictive operation portion constituting each side wall has layered piezoelectric/electrostrictive bodies and a pair of driving electrodes alternately stacked in a height direction of the side wall, and the displacement is caused by a vertical effect of an electric field induced strain. On the other hand, in each of cell driving type piezoelectric/electrostrictive actuators 80, 90, the piezoelectric/electrostrictive operation portion constituting each side wall has platy piezoelectric/electrostrictive bodies and a pair of driving electrodes formed on the side surfaces of the piezoelectric/electrostrictive body, and the displacement is generated by the transverse effect of the electric field induced strain.

Figure 2:
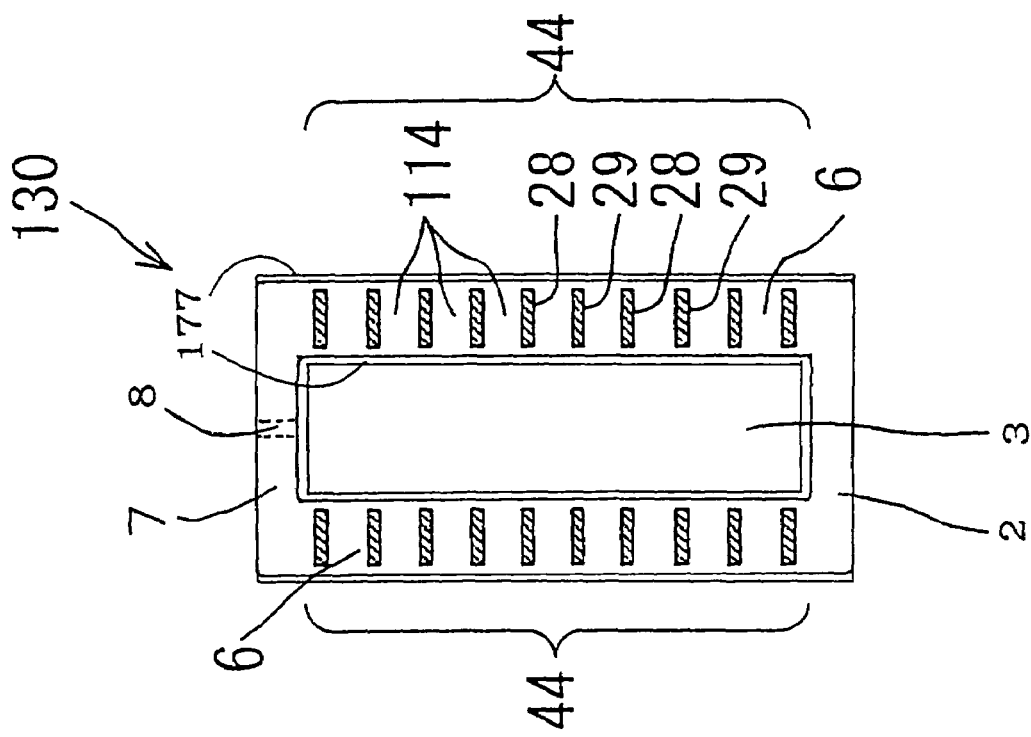
FIG. 2 is a cross-sectional view of a cell showing one embodiment of the first cell driving type piezoelectric/electrostrictive actuator according to the present invention.

FIG. 2 is a cross-sectional view of the cell showing one embodiment of the cell driving type piezoelectric/electrostrictive actuator according to the present invention. In the shown cell driving type piezoelectric/electrostrictive actuator 110, each of two side walls 6 comprises a piezoelectric/electrostrictive operation portion 34, the piezoelectric/electrostrictive operation portion 34 has a plurality of layered piezoelectric/electrostrictive bodies 114 and driving electrodes 28, 29 alternately stacked in a height direction of the side wall 6, and the displacement is caused by the vertical effect of the electric field induced strain. Nine layers of piezoelectric/electrostrictive bodies 114 are disposed in the side wall 6, and ten layers (nine pairs) in total of the driving electrodes 28, 29 having different polarities are stacked via the piezoelectric/electrostrictive bodies 114.

In the cell driving type piezoelectric/electrostrictive actuator 110, the driving electrodes 28, 29 are layered, and opposite end portions of the layer are exposed to stacked sections of the piezoelectric/electrostrictive bodies 114. Wirings for connecting the plurality of driving electrodes 28, 29 are not formed as external electrodes on the surface of the side wall 6, and are disposed in the piezoelectric/electrostrictive bodies 114 (although not shown). Concretely, the wirings for supplying powers to the respective driving electrodes 28, 29 from the outside in order to cause the displacement in the piezoelectric/electrostrictive operation portion 34 are drawn around via via-holes inside the piezoelectric/electrostrictive bodies 114, and can accordingly be formed separately in desired positions of the piezoelectric/electrostrictive bodies 114.

In the cell driving type piezoelectric/electrostrictive actuator 110, since the end portions of the driving electrodes 28, 29 are exposed to the stacked layer sections of the piezoelectric/electrostrictive bodies 114. When a conductive liquid is charged in the cell 3, the cell short-circuits. Therefore, insulating films 117 are formed as thin films on cell inner and outer surfaces of the side wall 6. The thin film may be a protector film, a moistureproof film or the like instead of the insulating film, or a multilayered film depending on properties of the liquid charged in the cell 3.

In the cell driving type piezoelectric/electrostrictive actuator 110, the layered piezoelectric/electrostrictive bodies 114 are polarized, for example, in a direction toward the driving electrode 29 from the driving electrode 28 (a vertical direction in FIG. 2) (a polarization direction differs with each piezoelectric/electrostrictive body 114 by the driving electrode to be held). Moreover, a voltage is applied between the driving electrodes 28, 29 via the wiring (not shown) in such a manner that a driving electrode 28 side is positive and a driving electrode 29 side is negative, and accordingly the electric field is formed in the same direction as the above-described polarization direction. In other words, in the cell driving type piezoelectric/electrostrictive actuator 110, the piezoelectric/electrostrictive bodies 114 whose polarization directions are opposite to each other are stacked via the driving electrodes 28, 29, and the polarization and the driving electric field have the same direction in each of the piezoelectric/electrostrictive bodies 114. As a result, an electric field induced strain is developed in the piezoelectric/electrostrictive bodies 114. In the piezoelectric/electrostrictive operation portion 34, the piezoelectric/electrostrictive body 114 held between the driving electrodes 28, 29 contracts/expands substantially in the vertical direction (the same direction as the height direction of the side wall 6) in FIG. 2 based on the displacement by the vertical effect of the electric field induced strain, and the volume of the cell 3 is changed.

In the cell driving type piezoelectric/electrostrictive actuator 110, the displacement of the piezoelectric/electrostrictive body 114 directly utilizes the electric field induced strain, therefore a generating force of the displacement is large, and a response speed is also high. The displacements developed by the individual piezoelectric/electrostrictive bodies 114 are not large, but the displacement is proportional to the number of the stacked layers. Therefore, when the number of the stacked layers is increased, a large displacement can be obtained. When a thickness of one layer of the piezoelectric/electrostrictive body 114 is set to preferably 100 µm or less, more preferably 10 to 80 µm, the driving is possible at a lower voltage.

Figure 3:
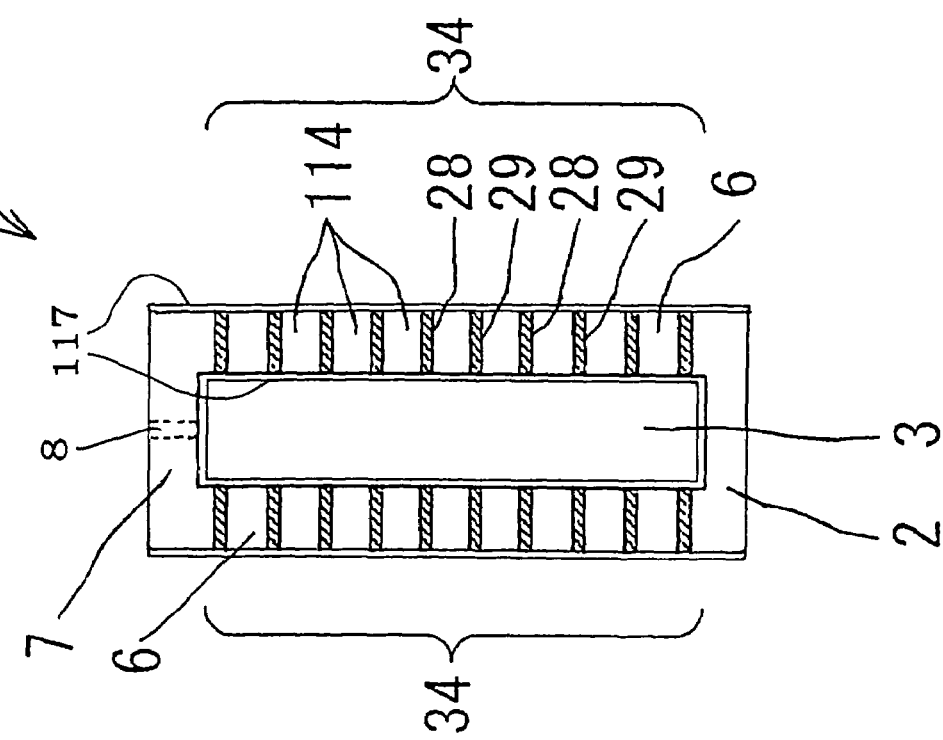
FIG. 3 is a cross-sectional view of a cell showing one embodiment of the first cell driving type piezoelectric/electrostrictive actuator according to the present invention.

FIG. 3 is a diagram showing one embodiment of the cell driving type piezoelectric/electrostrictive actuator according to the present invention, and is a cross-sectional view of the cell. In the shown cell driving type piezoelectric/electrostrictive actuator 130, each of two side walls 6 comprises a piezoelectric/electrostrictive operation portion 44, the piezoelectric/electrostrictive operation portion 44 has a plurality of layered piezoelectric/electrostrictive bodies 114 and driving electrodes 28, 29 alternately stacked in a height direction of the side wall 6, and the displacement is caused by the vertical effect of the electric field induced strain. Nine layers of piezoelectric/electrostrictive bodies 114 are disposed in the side wall 6, and ten layers (nine pairs) in total of the driving electrodes 28, 29 having different polarities are stacked via the piezoelectric/electrostrictive bodies 114.

In the cell driving type piezoelectric/electrostrictive actuator 130, wirings for connecting the plurality of driving electrodes 28, 29 are disposed in the piezoelectric/electrostrictive bodies 114 in the same manner as in the cell driving type piezoelectric/electrostrictive actuator 110. For example, the wirings are drawn around via via-holes inside the piezoelectric/electrostrictive bodies 114, and can accordingly be formed separately in desired positions of the piezoelectric/electrostrictive bodies 114.

The cell driving type piezoelectric/electrostrictive actuator 130 is different from the cell driving type piezoelectric/electrostrictive actuator 110 in that opposite end portions of the driving electrodes 28, 29 of the piezoelectric/electrostrictive operation portion 44 disposed in the side wall 6 are buried in the piezoelectric/electrostrictive bodies 114. The side walls 6 are integrally fired, any driving electrode is not exposed to the surface, and therefore a problem of a short-circuit of the driving electrode does not occur usually even in a case where a conductive liquid is charged in the cell 3. Therefore, for example, when the actuator is used as the ink jet printing head, an ink material to be charged in the cell is not limited. The thin film does not necessarily have to be formed in the side wall 6 for a purpose of insulation, but protector films 177 are formed on cell inner and outer surfaces in the cell driving type piezoelectric/electrostrictive actuator 130 in order to hold reliability of the actuator over a long period. A moistureproof film or the like may be formed instead of the protector film, or a multilayered film may be formed depending on properties of a liquid charged in the cell 3.

The cell driving type piezoelectric/electrostrictive actuator 130 conforms to the cell driving type piezoelectric/electrostrictive actuator 110 with respect to polarization, driving electric field, driving operation, displacement (generating force, low voltage) and the like.

Figure 4:
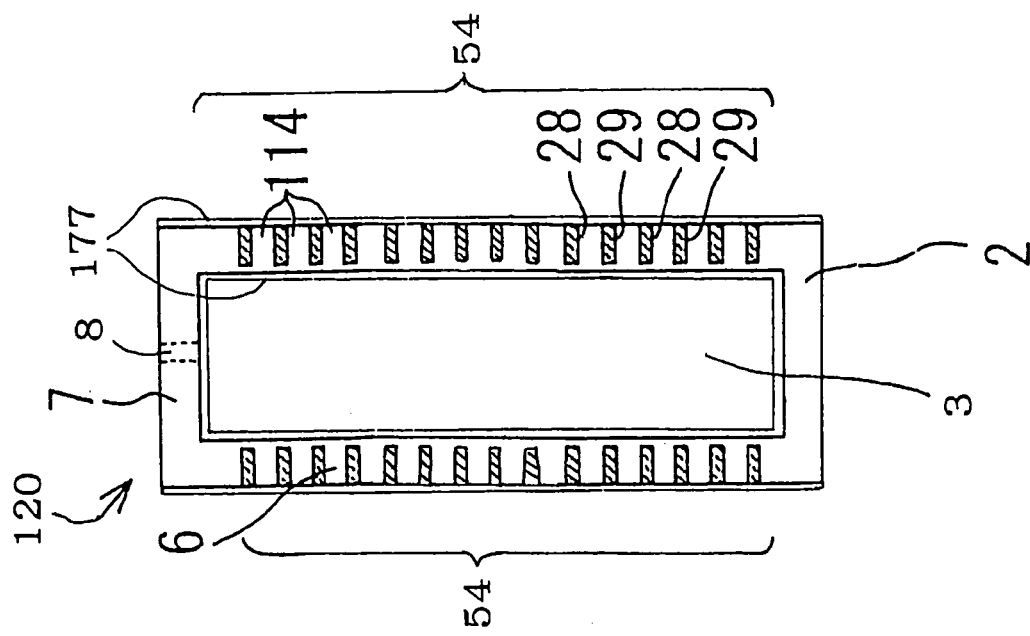
FIG. 4 is a cross-sectional view of the cell showing one embodiment of the first cell driving type piezoelectric/electrostrictive actuator according to the present invention.

FIG. 4 is a diagram showing one embodiment of the cell driving type piezoelectric/electrostrictive actuator according to the present invention, and is a cross-sectional view of the cell. In the shown cell driving type piezoelectric/electrostrictive actuator 140, each of two side walls 6 comprises a piezoelectric/electrostrictive operation portion 64, the piezoelectric/electrostrictive operation portion 64 has a plurality of layered piezoelectric/electrostrictive bodies 114 and driving electrodes 28, 29 alternately stacked in a height direction of the side wall 6, and the displacement is caused by the vertical effect of the electric field induced strain. The ceiling wall 7 comprises pores 8. Nine layers of piezoelectric/electrostrictive bodies 114 are disposed in the side wall 6, and ten layers (nine pairs) in total of the driving electrodes 28, 29 having different polarities are stacked via the piezoelectric/electrostrictive bodies 114.

In the cell driving type piezoelectric/electrostrictive actuator 140, wirings for connecting the plurality of driving electrodes 28, 29 are formed as external electrodes on the side wall 6. The external electrodes are an electrode film 18 which is a common electrode (wiring) formed on the cell inner surface of the side wall 6, and an electrode film 19 which is an individual electrode (wiring) formed on the cell outer surface of the side wall 6. The electrode film 18 formed on the cell inner surface is a seamless film which coats the whole cell inner surface. One of end portions of each of the layered driving electrodes 28, 29 is buried in the piezoelectric/electrostrictive body 114, the other end is exposed from the piezoelectric/electrostrictive body 114, the driving electrode 28 is connected to the electrode film 18, and the driving electrode 29 is connected to the electrode film 19.

In the cell driving type piezoelectric/electrostrictive actuator 140, protector films 177 are formed on the electrode films 18, 19 on the cell inner and outer surfaces of the side wall 6. The protector film 177 on the cell inner surface is formed as a seamless protector film which coats the whole cell inner surface (on the electrode film 18), and constitutes one or more layers of the seamless thin films which coat the whole cell inner surface mentioned in the present invention together with the electrode film 18 in the cell driving type piezoelectric/electrostrictive actuator 140. A moistureproof film or the like may be formed instead of the protector film, or a multilayered film may be formed depending on properties of a liquid charged in the cell 3.

It is to be noted that although not shown, a conductive barrier film may be formed (on a lower surface) prior to the electrode films 18, 19 on the side wall 6. Needless to say, at least a barrier film formed on the cell inner surface among the barrier films is preferably formed as a seamless barrier film which coats the whole cell inner surface. Then, for example, when forming one single-layer film or double-layer or multilayered film comprising an insulating film, a protector film, or a moistureproof film after forming the electrode films 18, 19, piezoelectric/electrostrictive characteristics do not easily drop without diffusing components of the electrode film in the piezoelectric/electrostrictive body, or conversely diffusing components of the piezoelectric/electrostrictive body in the electrode film by heating.

The cell driving type piezoelectric/electrostrictive actuator 140 conforms to the cell driving type piezoelectric/electrostrictive actuator 110 or 130 with respect to polarization, driving electric field, driving operation, displacement (generating force, low voltage) and the like.

Figure 5:
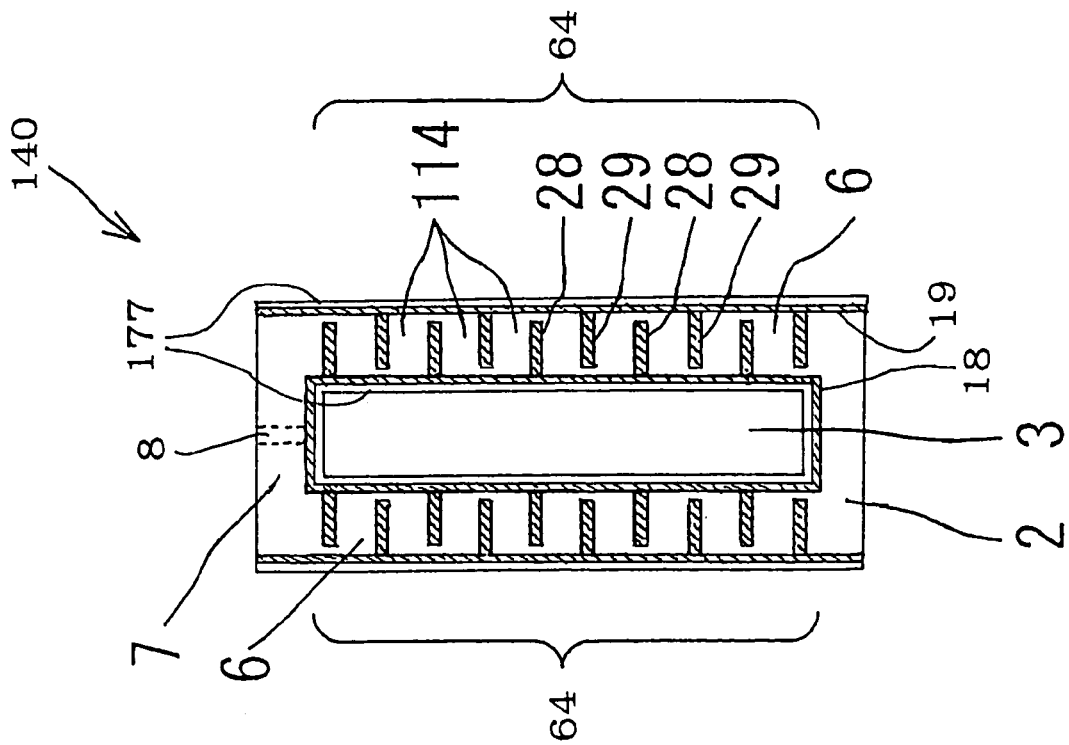
FIG. 5 is a cross-sectional view of the cell showing one embodiment of the first cell driving type piezoelectric/electrostrictive actuator according to the present invention.

FIG. 5 is a diagram showing one embodiment of the cell driving type piezoelectric/electrostrictive actuator according to the present invention, and is a cross-sectional view of the cell. In the shown cell driving type piezoelectric/electrostrictive actuator 120, each of two side walls 6 comprises a piezoelectric/electrostrictive operation portion 54, the piezoelectric/electrostrictive operation portion 54 has a plurality of layered piezoelectric/electrostrictive bodies 114 and driving electrodes 28, 29 alternately stacked in a height direction of the side wall 6, and the displacement is caused by the vertical effect of the electric field induced strain. Fourteen layers of piezoelectric/electrostrictive bodies 114 are disposed in the side wall 6, and fifteen layers (fourteen pairs) in total of the driving electrodes 28, 29 having different polarities are stacked via the piezoelectric/electrostrictive bodies 114.

In the cell driving type piezoelectric/electrostrictive actuator 120, wirings for connecting the plurality of driving electrodes 28, 29 are disposed in the piezoelectric/electrostrictive bodies 114 in the same manner as in the cell driving type piezoelectric/electrostrictive actuator 110 or 130. For example, the wirings are drawn around via via-holes inside the piezoelectric/electrostrictive bodies 114, and can accordingly be formed separately in desired positions of the piezoelectric/electrostrictive bodies 114.

The cell driving type piezoelectric/electrostrictive actuator 120 is different from the cell driving type piezoelectric/electrostrictive actuator 110 in that only end portions on a cell inner surface side are buried in the piezoelectric/electrostrictive bodies 114 among end portions of the driving electrodes 28, 29 of the piezoelectric/electrostrictive operation portion 54 disposed in the side wall 6. The side walls 6 are integrally fired, any driving electrode is not exposed to the surface, and therefore a problem of a short-circuit of the driving electrode does not occur usually even in a case where a conductive liquid is charged in the cell 3 in the same manner as in the cell driving type piezoelectric/electrostrictive actuator 130. Therefore, for example, when the actuator is used as the ink jet printing head, an ink material to be charged in the cell is not limited. The thin film does not necessarily have to be formed in the side wall 6 for a purpose of insulation, but protector films 177 are formed on cell inner and outer surfaces in the cell driving type piezoelectric/electrostrictive actuator 120 in order to hold reliability of the actuator over a long period. A moistureproof film or the like may be formed instead of the protector film, or a multilayered film may be formed depending on properties of the liquid charged in the cell 3.

The cell driving type piezoelectric/electrostrictive actuator 120 conforms to the cell driving type piezoelectric/electrostrictive actuator 110 or the like with respect to polarization, driving electric field, driving operation, displacement (generating force, low voltage) and the like.

Figure 6:
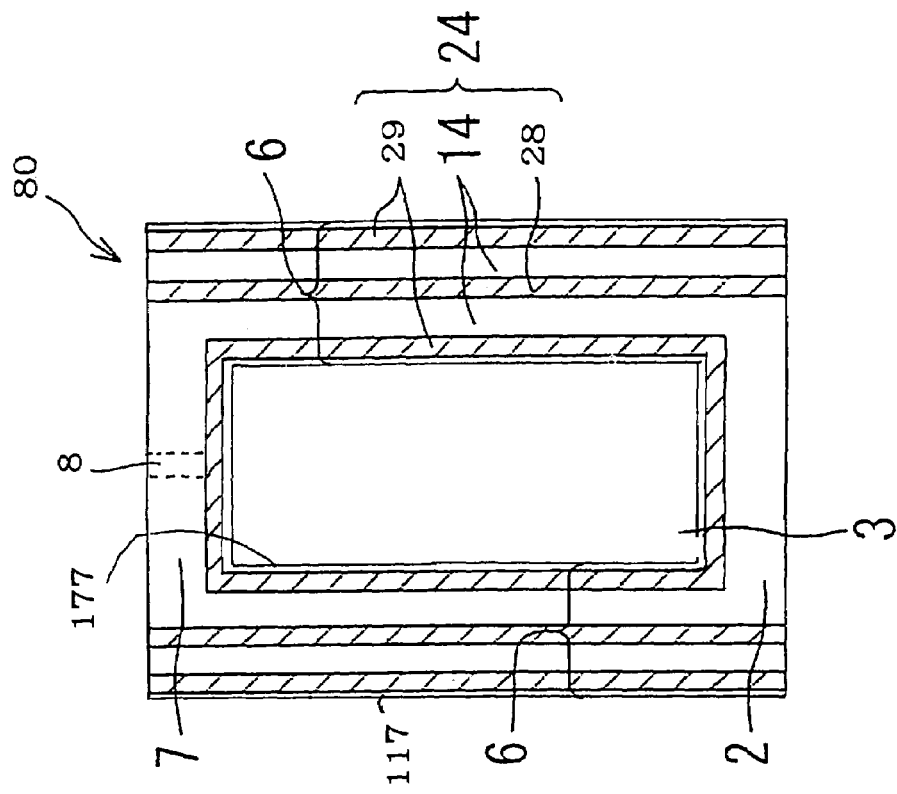
FIG. 6 is a cross-sectional view of the cell showing one embodiment of the first cell driving type piezoelectric/electrostrictive actuator according to the present invention.

FIG. 6 is a diagram showing one embodiment of the cell driving type piezoelectric/electrostrictive actuator according to the present invention, and is a cross-sectional view of the cell. In the shown cell driving type piezoelectric/electrostrictive actuator 90, each of two side walls 6 comprises a piezoelectric/electrostrictive operation portion 4, the piezoelectric/electrostrictive operation portion 4 has a platy piezoelectric/electrostrictive body 14 and driving electrodes 28, 29 alternately stacked in a width direction of the side wall 6 (transverse direction in FIG. 6), the piezoelectric/electrostrictive body 14 causes displacement by a transverse effect of the electric field induced strain.

In the cell driving type piezoelectric/electrostrictive actuator 90, a pair of driving electrodes 28, 29 are formed on the cell inner and outer surfaces of the side wall 6, and the driving electrode 28 formed on the cell inner surface is formed as a seamless electrode film which coats the whole cell inner surface. Protector films 177 are formed on the driving electrodes 28, 29 on the cell inner and outer surfaces of the side wall 6. The protector film 177 on a cell inner surface side is formed as a seamless protector film which coats the whole cell inner surface (on the driving electrode 28 (electrode film)), and constitutes one or more layers of the seamless thin films which coat the whole cell inner surface mentioned in the present invention together with the driving electrode 28 in the cell driving type piezoelectric/electrostrictive actuator 90. A moistureproof film or the like may be formed instead of the protector film, or a multilayered film may be formed depending on properties of a liquid charged in the cell 3.

It is to be noted that although not shown, a barrier film may be formed (on a lower surface) prior to the driving electrodes 28, 29 on the side wall 6. Needless to say, at least a barrier film formed on the cell inner surface among the barrier films is preferably formed as a seamless barrier film which coats the whole cell inner surface. Then, for example, when forming one single-layer film or double-layer or multilayered film comprising an insulating film, a protector film, or a moistureproof film on the driving electrodes 28, 29 after forming the driving electrodes, the piezoelectric/electrostrictive body 14 and the driving electrodes 28, 29 are heated, and components of the electrode film are diffused in the piezoelectric/electrostrictive body, or conversely components of the piezoelectric/electrostrictive body are diffused in the electrode film. However, this phenomenon can be eliminated, and piezoelectric/electrostrictive characteristics can be prevented from being degraded.

In the cell driving type piezoelectric/electrostrictive actuator 90, the platy piezoelectric/electrostrictive body 14 is polarized, for example, in a direction toward the driving electrode 29 from the driving electrode 28 (right/left direction (transverse direction) in FIG. 6). Moreover, a voltage is applied between the driving electrodes 28, 29 in such a manner that a driving electrode 28 side is positive and a driving electrode 29 side is negative, and accordingly the electric field is formed in the same direction as the above-described polarization direction. That is, in the cell driving type piezoelectric/electrostrictive actuator 90, the polarization and the driving electric field have the same direction. As a result, an electric field induced strain is developed in the piezoelectric/electrostrictive body 14. In the piezoelectric/electrostrictive operation portion 4, the piezoelectric/electrostrictive body 14 held between the driving electrodes 28, 29 contracts/expands substantially in the vertical direction (the same direction as the height direction of the side wall 6) in FIG. 6 based on the displacement by the transverse effect of the electric field induced strain, and the volume of the cell 3 is changed.

In the cell driving type piezoelectric/electrostrictive actuator 90, the displacement of the piezoelectric/electrostrictive body 114 directly utilizes the electric field induced strain, therefore a generating force of the displacement is large, and a response speed is also high.

Figure 7:
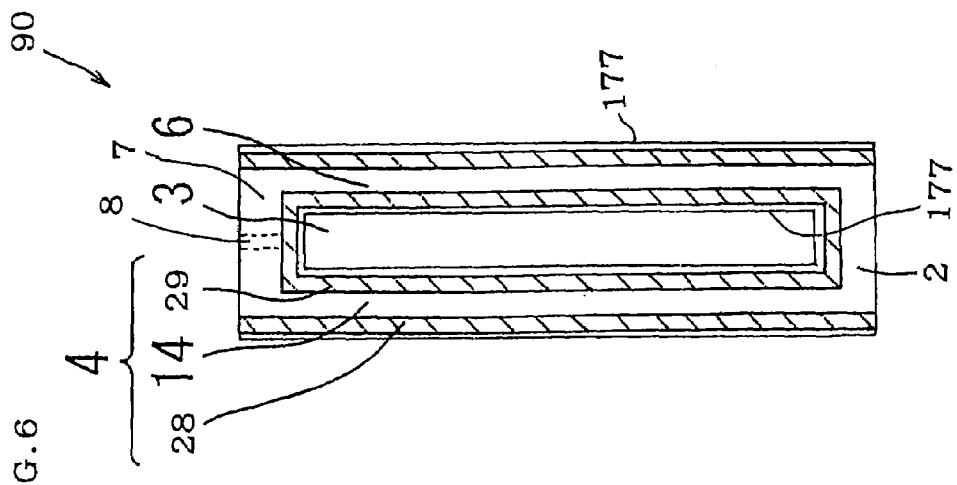
FIG. 7 is a cross-sectional view of the cell showing one embodiment of the first cell driving type piezoelectric/electrostrictive actuator according to the present invention.
Figure 8A:
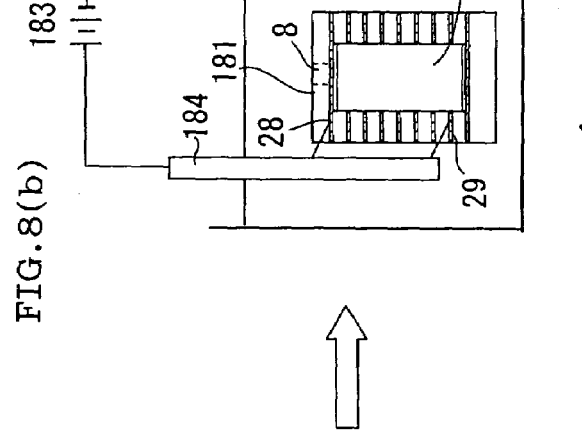
FIGS. 8(a) to 8(d) are explanatory views of film forming steps by an electrophoresis process.
Figure 8B:
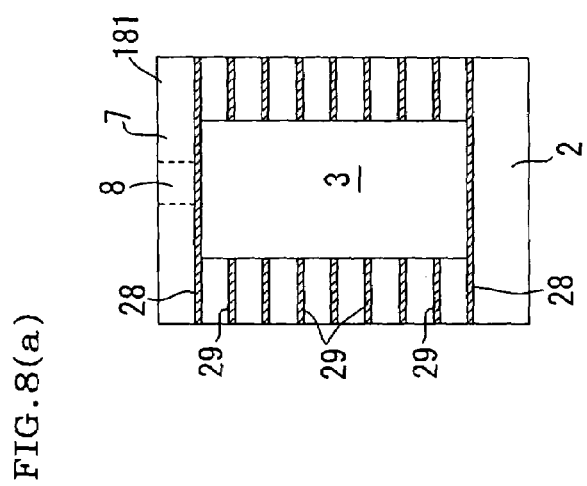
Figure 8C:
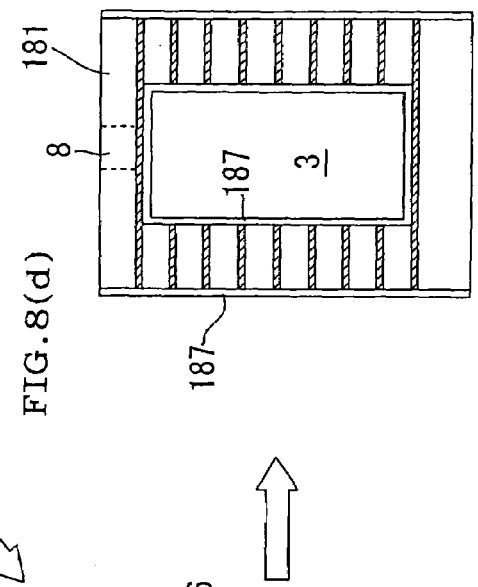
Figure 8D:
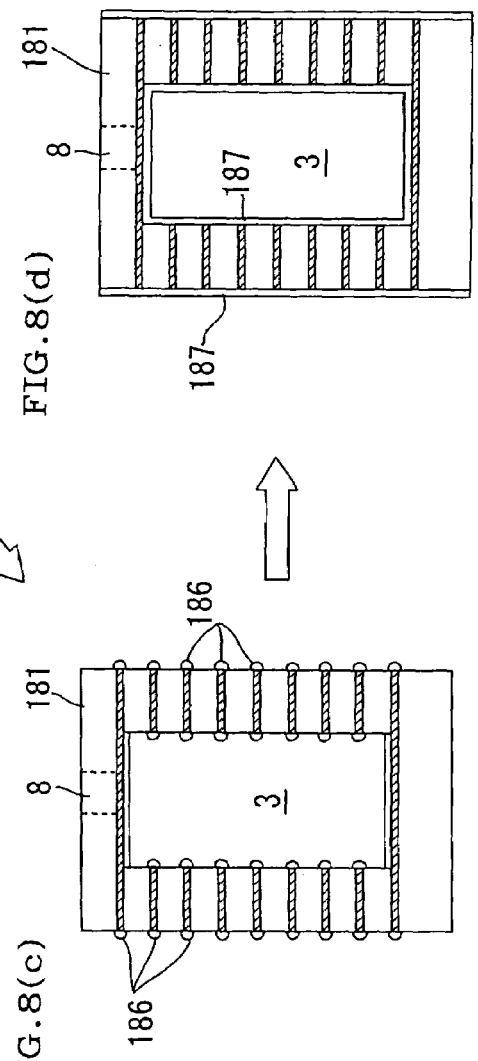

FIG. 7 is a diagram showing one embodiment of the cell driving type piezoelectric/electrostrictive actuator according to the present invention, and is a cross-sectional view of the cell. The cell driving type piezoelectric/electrostrictive actuator 80 is different from the cell driving type piezoelectric/electrostrictive actuator 90 in that a platy piezoelectric/electrostrictive body 14 constituting each of two side walls 6 has two layers, each of two layers of the piezoelectric/electrostrictive bodies 14 is held between driving electrodes 28, 29, and the bodies are stacked in a width direction of the side wall 6 (in a transverse direction in FIG. 7) to form a piezoelectric/electrostrictive operation portion 24. However, the cell driving type piezoelectric/electrostrictive actuator 80 is similar to the cell driving type piezoelectric/electrostrictive actuator 90, for example, in that protector films 177 are formed as thin films on the driving electrodes 28, 29 on the cell inner and outer surfaces of the side wall 6.

In the cell driving type piezoelectric/electrostrictive actuator 80, as compared with the cell driving type piezoelectric/electrostrictive actuator having the same thickness (width) of the side wall 6, the piezoelectric/electrostrictive body 14 per layer can be thinner, and a larger displacement and a higher generative force per a certain driving voltage can be developed. It is to be noted that in the cell driving type piezoelectric/electrostrictive actuator according to the present invention, the platy piezoelectric/electrostrictive body preferably comprises two or more layers. When the number of the stacked piezoelectric/electrostrictive bodies is increased, strength and rigidity of the side wall are enhanced, and an actuator capable of responding at a higher speed can be formed. The thickness per layer of the piezoelectric/electrostrictive body is preferably 100 μm or less, more preferably 10 to 30 μm. In this case, a lower driving voltage, higher strength, and higher integration of the actuator can be realized. Since the cell driving type piezoelectric/electrostrictive actuator 80 has a plywood-like side wall 6 as shown in FIG. 7, mechanical strength is enhanced, and durability is raised. Furthermore, when the exposed driving electrode 29 in the cell is used as the common electrode, the number of the layers of the platy piezoelectric/electrostrictive bodies is set to be even, and accordingly both electrodes exposed to the inside/outside of the cell can be used as common electrodes. The driving electrode 28 which is an individual electrode is not exposed. Therefore, an electric defect such as short-circuit can be avoided, and the reliability of the actuator can be enhanced.

The cell driving type piezoelectric/electrostrictive actuators according to the present invention have been described above. Next, a method of manufacturing the cell driving type piezoelectric/electrostrictive actuator according to the present invention will be described.

An object of the method of manufacturing the cell driving type piezoelectric/electrostrictive actuator according to the present invention is an actuator comprising: one or a plurality of cells each formed by a wall portion including two side walls, and a ceiling wall and a bottom wall connected to the two side walls, at least two side walls comprising piezoelectric/electrostrictive operation portions, wherein at least one pore is disposed in the wall portion other than said at least two side walls comprising the piezoelectric/electrostrictive operation portions, and one or more layers of seamless thin films which coat a whole cell inner surface of the wall portion are formed, and corresponds to the cell driving type piezoelectric/electrostrictive actuator according to the present invention.

The of manufacturing the cell driving type piezoelectric/electrostrictive actuator according to the present invention is characterized in steps of forming the seamless thin film, and the steps are performed as follows. First, each cell is formed by the wall portion including side walls, the ceiling wall, and the bottom wall. In this case, at least two side walls which face each other in the wall portion comprise the piezoelectric/electrostrictive bodies, and at least one pore is disposed in the wall portion other than said at least two side walls comprising the piezoelectric/electrostrictive operation portion. Next, a film forming material is introduced into the cell through the pores by predetermined film forming means, and the thin film is formed on the cell inner surface of the wall portion. Although the pores extending through the cell exist, the cell which is a sealed space excluding the pores is first formed, thereafter the film forming material is introduced into the cell, and therefore the formed thin film is a seamless film which coats the whole cell inner surface.

In the method of manufacturing the cell driving type piezoelectric/electrostrictive actuator according to the present invention, means for forming the cell by the wall portion is not limited. Examples of a preferable method include a ceramic green sheet stacking method. Moreover, a step of firing/integrating the side walls, the ceiling wall, and the bottom wall constituting the wall portion is preferably adopted.

In the method of manufacturing the cell driving type piezoelectric/electrostrictive actuator according to the present invention, first, one example of a first method of manufacturing the cell driving type piezoelectric/electrostrictive actuator will be described concretely hereinafter. FIGS. 10(*a*) to 10(*c*) are explanatory views showing one example of schematic steps of the first method of manufacturing the cell driving type piezoelectric/ electrostrictive actuator according to the present invention. A preparation object is the cell driving type piezoelectric/electrostrictive actuator 110 shown in FIG. 2. As described above, the cell driving type piezoelectric/electrostrictive actuator 110 comprises a plurality of cells in conformity to the cell driving type piezoelectric/electrostrictive actuator 1 shown in FIGS. 1(1), 1(*b*) as a whole constitution of an actuator including the pores, dummy cells and the like. The pores disposed in the ceiling wall are utilized as nozzles for discharging the liquid from the cell or holes for introducing the liquid into the cell, and the constitution is applicable to a liquid discharge device of a ink jet printing head or the like.

First, the predetermined number of ceramic green sheets formed of piezoelectric/electrostrictive materials which are main components are prepared. The ceramic green sheets can be prepared by a method which has heretofore been known. For example, a piezoelectric/electrostrictive material powder is prepared, and a binder, solvent, dispersant, plasticizer or the like is mixed into the material in a desired composition to prepare a slurry. After defoaming the slurry, it is possible to form the ceramic green sheet by green sheet forming methods such as a doctor blade method, and a reverse roll coater method. It is to be noted that in the present specification, the ceramic green sheet is referred to simply as the green sheet.

The obtained ceramic green sheet is punched, for example, by a punch and a die, and green sheets 602, 615, 619 are obtained as shown in FIG. 10(*a*). One sheet of each of the green sheets 602, 619 may be prepared, and a plurality of green sheets 615 is prepared. The green sheets 615 later form piezoelectric/electrostrictive bodies in the side walls (piezoelectric/electrostrictive operation portions), and in each of the green sheets, slits 605 constituting cells later, slits 625 constituting dummy cells later, circular holes 628 constituting via-holes for individual wirings, and a circular hole 629 constituting a via-hole for a common wiring are formed. The green sheet 602 constitutes the bottom wall later, and slits 625 constituting the dummy cells later are formed in the green sheet. The green sheet 619 constitutes the ceiling wall later, and slits 625 constituting dummy cells later, and micro circular holes 608 constituting pores 8 (see FIG. 10(*c*) of the cell driving type piezoelectric/electrostrictive actuator 110 later are formed in the green sheet. It is to be noted that each of the micro circular holes 608 is processed into a diameter of 200 μm or less. A material other than the piezoelectric/electrostrictive material may be used in each of the prepared green sheets 602 and 619.

Next, as shown in FIG. 10(*b*), the circular holes 628, 629 of the plurality of green sheets 615 are filled with conductive materials to form via-holes 128, 129. Conductor films (films formed of the conductive materials which are main components) 318 connected to the via-holes 128 are formed in a half of the green sheets 615, and conductor films 319 connected to the via-holes 129 are formed in the other half of the green sheets to obtain a plurality of green sheets 614, 616. It is to be noted that the conductor films can be formed into predetermined patterns by means such as screen printing and photolithography.

Five slits 605 in each of the green sheets 614, 616 are holes constituting cells later, and are opened to be larger than the slits 625. Six slits 625 are holes constituting dummy cells which are spaces between the cells later, and are arranged in such a manner as to hold the slit 605 therebetween. A green sheet solid portion between the slits 605 and 625 constitutes the side wall later. A part of the conductor film 318 constitutes one driving electrode, and a part of the electrode is used as an individual wiring. A part of the conductor film 319 constitutes another driving electrode later, and a part of the electrode is used as a common wiring. The conductor films 318, 319 are both disposed in such a manner as to be exposed to a surface in which the slits 605 constituting the cell later are formed, and a surface in which the slits. 625 constituting the dummy cells later are formed.

Next, the green sheet 602 is used as a lowermost layer, the green sheet 619 is used as an uppermost layers, and between these layers, a plurality of green sheets 614, 616 for forming the cells are alternately stacked, and the green sheets 602, 614, 616, 619 are compression-bonded to obtain a ceramic green laminated body having a predetermined thickness, and fired/integrated to obtain a fired laminated body (not shown). The fired laminated body comprises five cells in which the slits 605 of the green sheets 614, 616 communicate with each other, and six dummy cells in which the pores connected to the cells communicate with the slits 625 of the green sheets 602, 614, 616, 619.

Next, the film forming material is introduced into the cell through the pores using predetermined film forming means with respect to the fired laminated body, and the protector films are formed on all cell inner surfaces. Moreover, the protector film is also formed on the surface forming the dummy cell in the cell outer surface, and the film forming means is not limited. It is to be noted that the protector film of the cell outer surface may be patterned by applying and exposing a photoresist beforehand, and unnecessary portions may be removed by a process such as grinding after forming films on all cell outer surfaces.

Moreover, if necessary, external wirings are connected, and the piezoelectric/electrostrictive bodies are polarized. Then, the cell driving type piezoelectric/electrostrictive actuator 110 is obtained (FIG. 10(*c*)). In the cell driving type piezoelectric/electrostrictive actuator 110, the dummy cells 15 and the pores 8 appear on the surface, but the cells are formed inside and are not exposed. It is to be noted that the obtained cell driving type piezoelectric/electrostrictive actuator 110 is an actuator comprising a plurality of cells, but the cell driving type piezoelectric/-electrostrictive actuator according to the present invention may comprise one cell. To prepare the cell driving type piezoelectric/electrostrictive actuator, in accordance with the above-described manufacturing steps, after obtaining the actuator comprising a plurality of cells, the actuator is divided. Alternatively, in the manufacturing steps, one slit 605 (constituting the cell later) is formed in the green sheet 615, and two slits 625 (constituting the cell later) are formed in each of the green sheets 602, 615, 619, so that the actuator comprising one cell can be prepared.

In the first method of manufacturing the cell driving type piezoelectric/electrostrictive actuator according to the present invention, most preferable film forming means is a chemical vapor deposition (CVD) process. When the film forming material is a gas, an evaporation polymerization process can be adopted as preferable means in addition to the CVD process. In the evaporation polymerization process, a plurality of monomers having organoleptic properties on opposite terminal ends are evaporated and allowed to react, and polymer thin films are formed. An organic thin film can be prepared in such a manner that molecular chains are highly oriented and arranged by setting not only a chemical structure but also a condition. For example, polyimide, polyurea, or the like can be formed into a film. Furthermore, when the film forming material is a liquid, a plating process, and an electrophoresis process can be adopted as preferable means. The above-described film forming means are preferably combined to form the thin film. By the film forming means, the electrode film, barrier film, insulating film, and moistureproof film can be formed in addition to the protector film in the above-described step.

First the CVD process will be described hereinafter among the film forming means. For example, conditions in a case where a tantalum oxide ($Ta_2O_5$) is formed as the insulating film, a titanium nitride (TiN)-film is formed as the barrier film, and a copper (Cu) film is formed as the electrode film will be described hereinafter.

This corresponds to the film forming means in manufacturing the actuator in which the barrier film, electrode film, and insulating film are preferably formed on the cell inner surface in order from the surface of the wall portion (piezoelectric/electrostrictive body) as in the cell driving type piezoelectric/electrostrictive actuators 80, 90, 140 (see FIGS. 7, 6, 4).

Figure 11:
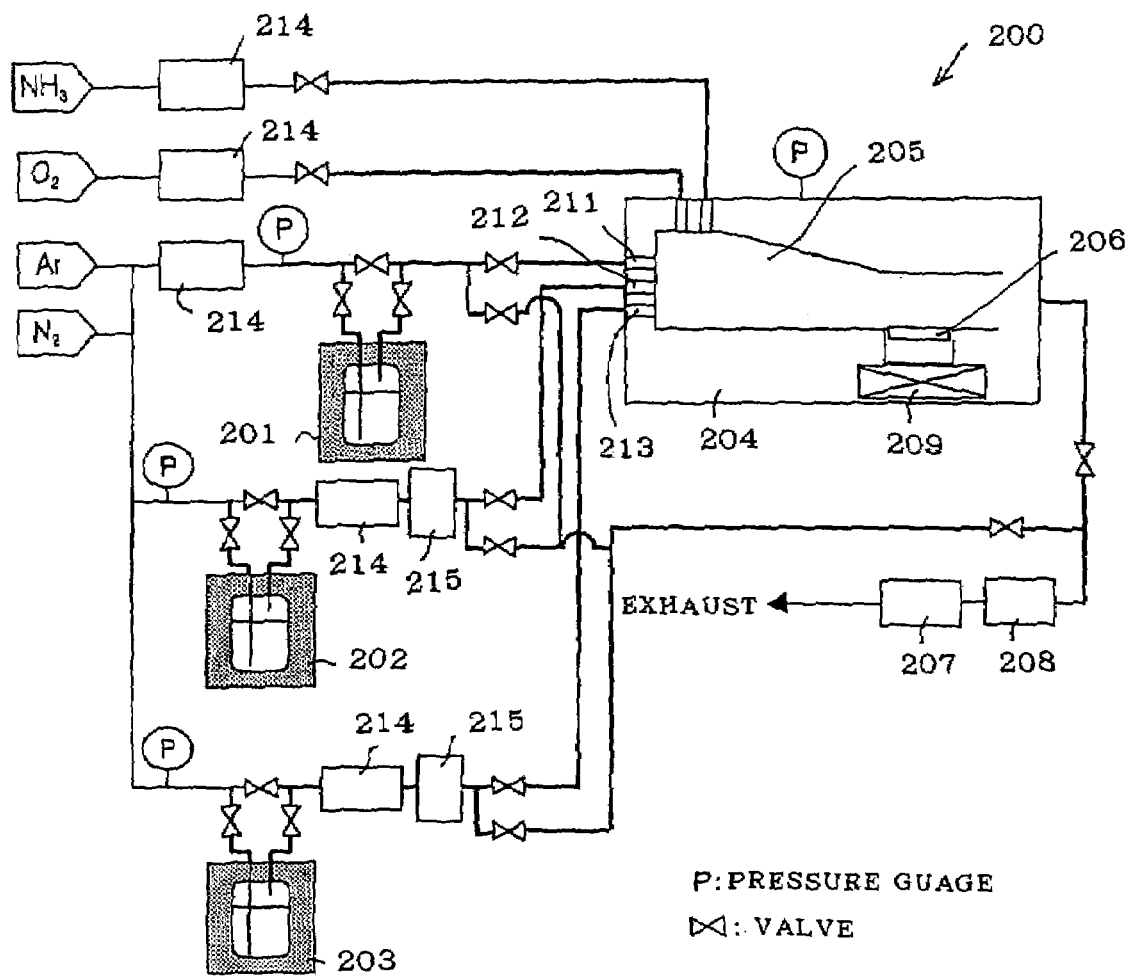
FIG. 11 is a schematic constitution diagram of an MOCVD film forming device for use in a CVD process of film forming means.

FIG. 11 is a schematic constitution diagram of a metalorganic chemical vapor deposition (MOCVD) film forming device for use in a CVD process. In the CVD process, the fired laminated body subjected to film formation is stored in a reactor 204, the film forming material is introduced into the cell through the pores, and the protector films are formed on all the cell inner surfaces. Moreover, the protector film is also formed on the cell outer surface. In an MOCVD film forming device 200, argon (Ar) or nitrogen ($N_2$) is used as a carrier gas, and oxygen ($O_2$) or ammonia ($NH_3$) is used as a reactive gas. Raw materials for the respective thin films are sealed in stainless containers, and stored in separate ovens 201, 202, 203 whose temperatures are controlled. The reactor 204 has a double-tube structure formed of quartz, and an inner tube 205 has a transverse constitution. A substrate 206 is heated by a heater 209, and exhausting is performed by a rotary pump 207 and a turbo molecule pump 208.

As the film forming materials which are the raw materials for the respective thin films, concretely, a Ta-based material is stored in the oven 201, a Ti-based material is stored in the oven 202, and a Cu-based material is stored in the oven 203. The ovens 201, 202, 203 are connected to the reactor 204 via independent pipes, and the raw materials for the respective thin films are introduced into the reactor 204 by inlets 211, 212, 213 via the respective pipes.

(Forming of Insulating Film) Penta ethoxy tantalum (Ta $(OC_2H_5)_5$) is used as the Ta-based material. In the MOCVD film forming device 200, the Ta-based material disposed in the oven 201 heated at 115° C. is conveyed by an argon gas, and introduced into the reactor 204 from the inlet 211. Oxygen is used as the reactive gas. A film forming temperature is 400° C., a film forming pressure is 200 Pa, and a film forming time is two hours. In this case, a thickness of the insulating film is, for example, 2 µm.

(Forming of Barrier Film) Tetrakis diethylamide titanium (TDEAT Ti[$N(C_2H_5)_2$]$_4$) is used as the Ti-based material. In the MOCVD film forming device 200, the Ti-based material disposed in the oven 202 is supplied into the reactor 204 by a mass flow controller 214 and a vaporizing unit 215. As the carrier gas, $N_2$ is used. As the reactive gas, $NH_3$ is used. A film forming temperature is 350° C., a film forming pressure is 10 Pa, and a film forming time is five minutes. In this case, a thickness of the insulating film is, for example, 50 nm. It is to be noted that as the barrier film, a tantalum nitride (TaN) film, niobium nitride (NbN) film or the like can be adopted in addition to the TiN film.

(Forming of Electrode Film) Copper hexafluoroacetyl acetate trimethyl vinyl silane (Cu(hfac) (tmvs)) is used as the Cu-based material. In the MOCVD film forming device 200, the Cu-based material disposed in the oven 203 is supplied into the reactor 204 by a mass flow controller 214 and a vaporizing unit 215. As the carrier gas, Ar is used. A film forming temperature is 210° C., a film forming pressure is 200 Pa, and a film forming time is 20 minutes. In this case, a thickness of the insulating film is, for example, 2 µm.

Next, an electrophoresis process which is film forming means will be described. FIGS. 8(*a*) to 8(*d*) are explanatory views of one example of film forming steps by the electrophoresis process. In this method, after depositing the film forming material on the electrode (e.g., the driving electrode) by the electrophoresis process, thermal treatment is performed to fluidize the film forming material, and the film is formed on the whole surface including the electrode. It is to be noted that examples of a prior technique for fluidizing the film forming material by the thermal treatment after depositing the film forming material on the electrode the electrode by the electrophoresis process includes Japanese Patent No. 3412090 specification.

This method is utilized as film forming means for the fired laminated body in manufacturing the actuator in which the driving electrode is exposed from the surface of the wall portion (piezoelectric/electrostrictive body) in the cell inner surface, and the insulating film is formed in order to coat the electrode as in the cell driving type piezoelectric/electrostrictive actuator 110 (see FIG. 2). Additionally, a certain or more amount of the film forming material to be deposited on the electrode needs to be secured in the electrophoresis process. Therefore, the fired laminated body which is an object of film formation preferably has a high ratio of the electrode occupying the cell inner surface. FIG. 8(*a*) is a cross-sectional view of the fired laminated body which is obtained in the process of the manufacturing of the cell driving type piezoelectric/electrostrictive actuator and on which the film is formed by the electrophoresis process. As shown, a fired laminated body 181 is different from the cell driving type piezoelectric/electrostrictive actuator 110 in that the driving electrodes 28 (electrode films) are formed on the cell inner surfaces of the ceiling wall 7 and the bottom wall 2, and the ratio of the electrode occupying the cell inner surface is high. It is to be noted that in the fired laminated body 181, a plurality of driving electrodes 28 conduct via via-holes, and this also applies to the driving electrodes 29.

For example, conditions in a case where a glass film is formed as the insulating film will be described hereinafter. In the electrophoresis process, first the fired laminated body 181 is immersed into a suspension 182 in which a glass powder is dispersed, an electrodeposition electrode 184 connected to driving electrodes 28, 29 is connected to a reference electrode 185 (platinum) via a power supply 183, and a voltage is applied, for example, on conditions of 30 V and five minutes (see FIG. 8(*b*)). Then, glass powders 186 move along an electric field, and are electrodeposited on portions to which the driving electrodes 28, 29 are exposed and in the vicinity (see FIG. 8(*c*)). Thereafter, the fired laminated body 181 onto which the glass powders 186 are electrodeposited is dried, and further thermally treated, for example, at 600° C. (not less than a softening point of the glass powder) for ten minutes. The glass powders 186 are fluidized to form a flat glass layer, cooled, and solidified to form glass insulating films 187 on the fired laminated body 181 (see FIG. 8(*d*)). The obtained glass insulating film 187 has a thickness of, for example, about 2 µm. It is to be noted that in FIG. 8(*b*), the suspension 182 containing the glass powders which are film forming materials is introduced into the cell 3 via pores 8 of the fired laminated body 181.

As the glass powder, for example, bismuth-zinc-borosilicate glass powders can be adopted. When the suspension is prepared, isopropyl alcohol is usable as the solvent, a solute concentration is set, for example, to 10% by mass, and 2% by mass of dispersant may be added to the glass powder. The suspension is preferably stirred well using a magnetic stirrer in such a manner that the glass powders are uniformly dispersed.

Moreover, a film formed of a material other than glass can be formed as the insulating film by the electrophoresis process. An electrodeposition solution of a polyimide resin, epoxy resin, acrylic resin or the like is used, the thermal treatment is added for polymerization, and accordingly coating films of the organic materials can be formed.

FIGS. 12(*a*) to 12(*d*) are explanatory views of another example of the film forming steps by the electrophoresis process. The film forming steps conform to the steps of FIGS. 8(*a*) to 8(*d*), but are different in the mode of the fired laminated body subjected to the film formation and in that the thermal treatments are performed twice. FIG. 12(*a*) shows a cross-sectional view of the fired laminated body obtained in the process of the manufacturing of the cell driving type piezoelectric/electrostrictive actuator and subjected to the film formation by the electrophoresis process. However, unlike the fired laminated body 181 of FIG. 8(*a*), in a shown fired laminated body 281, the driving electrode 28 (electrode film) is not formed on the cell inner surfaces of the ceiling wall 7 and the bottom wall 2.

Conditions, for example, in a case where a glass film is formed as the insulating film will be described hereinafter in the same manner as in the above-described example. First, the fired laminated body 281 is immersed into the suspension in which the glass powders are dispersed, the electrode connected to the driving electrodes 28, 29 is connected to the reference electrode via the power supply, and the voltage is applied, for example, on conditions of 30 V and five minutes (the drawing is omitted, but conforms to FIG. 8(*b*)). Then, the suspension containing the glass powders which are film forming materials is introduced into the cell 3 via the pores 8 of the fired laminated body 281, and the glass powders 186 in the suspension move along the electric field, and are electrodeposited on portions to which h driving electrodes 28, 29 are exposed and in the vicinity (see FIG. 12(*b*)). Thereafter, the fired laminated body 281 onto which the glass powders 186 are electrodeposited is dried, and further thermally treated, for example, at 600° C. for ten minutes to fluidize the glass powders 186. In this case, for example, the bottom wall 2 is disposed toward a gravity direction, and left to stand for a certain time. Then, the fluidized glass powders move, and a flat glass layer is formed including the cell inner surface of the bottom wall 2. Moreover, when the layer is cooled and solidified, glass insulating films 187 are formed excluding the cell inner surface of the ceiling wall 7 of the fired laminated body 281 (see FIG. 12(*c*)). Moreover, the thermal treatment is performed again, for example, at 600° C. for ten minutes to fluidize the glass powders 186. Next, the ceiling wall 7 is disposed toward the gravity direction, and left to stand for a certain time. Then, the fluidized glass powders move, and a flat glass layer is formed including the cell inner surface of the ceiling wall 7. Moreover, when the layer is cooled and solidified, glass insulating films 187 are formed on all cell inner surfaces of the fired laminated body 281 (see FIG. 12(*d*)). It is to be noted that the glass insulating films 187 form reaction layers with respect to the bottom wall 2. Therefore, even when the glass powders are fluidized again, the glass insulating film 187 formed on the cell inner surface of the bottom wall 2 in the first thermal treatment and cooling does not disappear.

Two examples of the film forming steps by the electrophoresis process have been described above. Additionally, after introducing the suspension containing the glass powders which are the film forming materials into the cell through the pores of the fired laminated body in the same manner as in the above-described two examples to electrodeposit the suspension on the portion to which the driving electrode is exposed and in the vicinity, the fired laminated body may be rotated, the fluidized glass powders are moved by a generated centrifugal force, and flat glass layers are formed on all the cell inner surfaces. Moreover, when the layers are cooled and solidified, the glass insulating films can be formed on all the cell inner surfaces of the fired laminated body.

Moreover, when the electrophoresis process is used as the film forming means, different film forming materials are deposited on portions to which the driving electrode is exposed for each polarity of the electrode. Thereafter, the materials may be mixed by the thermal treatment to obtain a complex material, and seamless thin films can be formed by the complex material. When the thin films are formed by this means, the coefficient of thermal expansion of the thin film can be adjusted, or the thin film having properties of the respective film forming materials can be formed. The means is useful in this manner.

FIGS. 14(*a*) to 14(*c*) are explanatory views of steps of using different film forming materials and forming seamless thin films by complex materials. The film forming steps conform to FIGS. 8(*a*) to 8(*d*), but are different in that two types of film forming materials are used. Conditions, for example, in a case where a glass film (complex film) in which silica is dispersed is formed as the insulating film will be described hereinafter.

First, a fired laminated body 381 is immersed in a suspension in which glass powders are dispersed, an electrode connected to driving electrodes 28 is connected to a reference electrode via a power supply, and a voltage is applied, for example, on conditions of 30 V and five minutes (the drawing is omitted, but conforms to FIG. 8(*b*)). Then, the suspension containing silica particles which are film forming materials is introduced into the cell 3 via the pores 8 of the fired laminated body 381, and silica particles 286 in the suspension move along the electric field, and are electrodeposited on portions to which driving electrodes 29 are exposed and in the vicinity (see FIG. 14(*a*)).

Next, the fired laminated body 381 is immersed in a suspension mixed with silica particles, an electrode connected to a driving electrode 29 is connected to a reference electrode via a power supply, and a voltage is applied, for example, on conditions of 30 V and five minutes (the drawing is omitted, but conforms to FIG. 8(*b*)). Then, the suspension containing the silica particles which are film forming materials is introduced into the cell 3 via the pores 8 of the fired laminated body 381, and silica particles 286 in the suspension move along an electric field and are electrodeposited in a portion to which the driving electrode 29 is exposed and in the vicinity (see FIG. 14(*a*)). Thereafter, the fired laminated body 381 onto which glass powders 285 and silica particles 286 are electrodeposited is dried, and further thermally treated, for example, at 600° C. for ten minutes to fluidize the glass powders 285. The powders are mixed and formed into a complex material. The fluidized complex material moves, and is formed into a flat layer. When the layer is cooled and solidified, a complex film 287 is formed on the cell inner surface of the fired laminated body 381 (see FIG. 14(*b*)). FIG. 14(*c*) is an enlarged diagram of part A of FIG. 14(*b*). As shown, the complex film 287 formed on the cell inner surface is a film in which silica particles 289 are dispersed in a glass film 288.

When the electrophoresis process is used as the film forming means, components of film forming materials may be allowed to react with those of materials constituting the wall portion to form a reaction layer between the seamless thin film and the wall portion (side wall, ceiling wall, bottom wall). When the reaction layer is formed by this means, adhesion between the thin film and the wall portion can be remarkably strengthened, and this is useful.

FIGS. 15(*a*) to 15(*c*) are explanatory views showing steps of allowing the components of the film forming materials to react with those of the materials constituting the wall portion to form the reaction layer. The film forming steps conform to FIGS. 8(*a*) to 8(*d*), and are characterized in that the film forming materials containing the components which react with those of the materials constituting the wall portion to form the reaction layer are selected. Conditions, for example, in a case where the reaction layer is formed by lead (Pb) and silicon (Si) will be described hereinafter.

First, all wall portions (including the side walls, ceiling wall, and bottom wall) of a fired laminated body 481 are formed of a lead (Pb)-containing lead zirconate titanate (PZT) material beforehand. Moreover, the fired laminated body 481 is immersed into a glass suspension containing silicon which is an element component, an electrode connected to driving electrodes 28, 29 is connected to a reference electrode via a power supply, and a voltage is applied, for example, on conditions of 30 V and five minutes (the drawing is omitted, but conforms to FIG. 8(*b*)). Then, the glass suspension containing silicon which is a film forming material is introduced into the cell 3 via the pores 8 of the fired laminated body 481, and glass particles 385 in the suspension move along an electric field, and are electrode-posited on portions to which the driving electrodes 28, 29 are exposed and in the vicinity (see FIG. 15(*a*)). Thereafter, the fired laminated body 481 onto which the glass particles 385 are electrodeposited is dried, and further thermally treated, for example, at 600° C. for ten minutes to fluidize the glass particles 385, and a glass layer is formed. When the layer is cooled and solidified, a glass insulating film 387 containing silicon as the element component is formed on the cell inner surface of the fired laminated body 481 (see FIG. 15(*b*)). FIG. 15(*c*) is an enlarged view of part B of FIG. 15(*b*). As shown, a part of the silicon-containing glass insulating film 387 formed on the cell inner surface constitutes a reaction layer 388 formed by reaction of silicon (Si) contained in the film with lead (Pb) contained in the wall portion.

Additionally, when the electrophoresis process is used as the film forming means, and the thermal treatment is performed twice or more times, the temperature for the thermal treatment, or the time for directing/disposing the ceiling wall or the bottom wall and leaving the wall to stand is adjusted, and accordingly fluidity (flow degree) of the glass powder can be adjusted.

Figure 13:
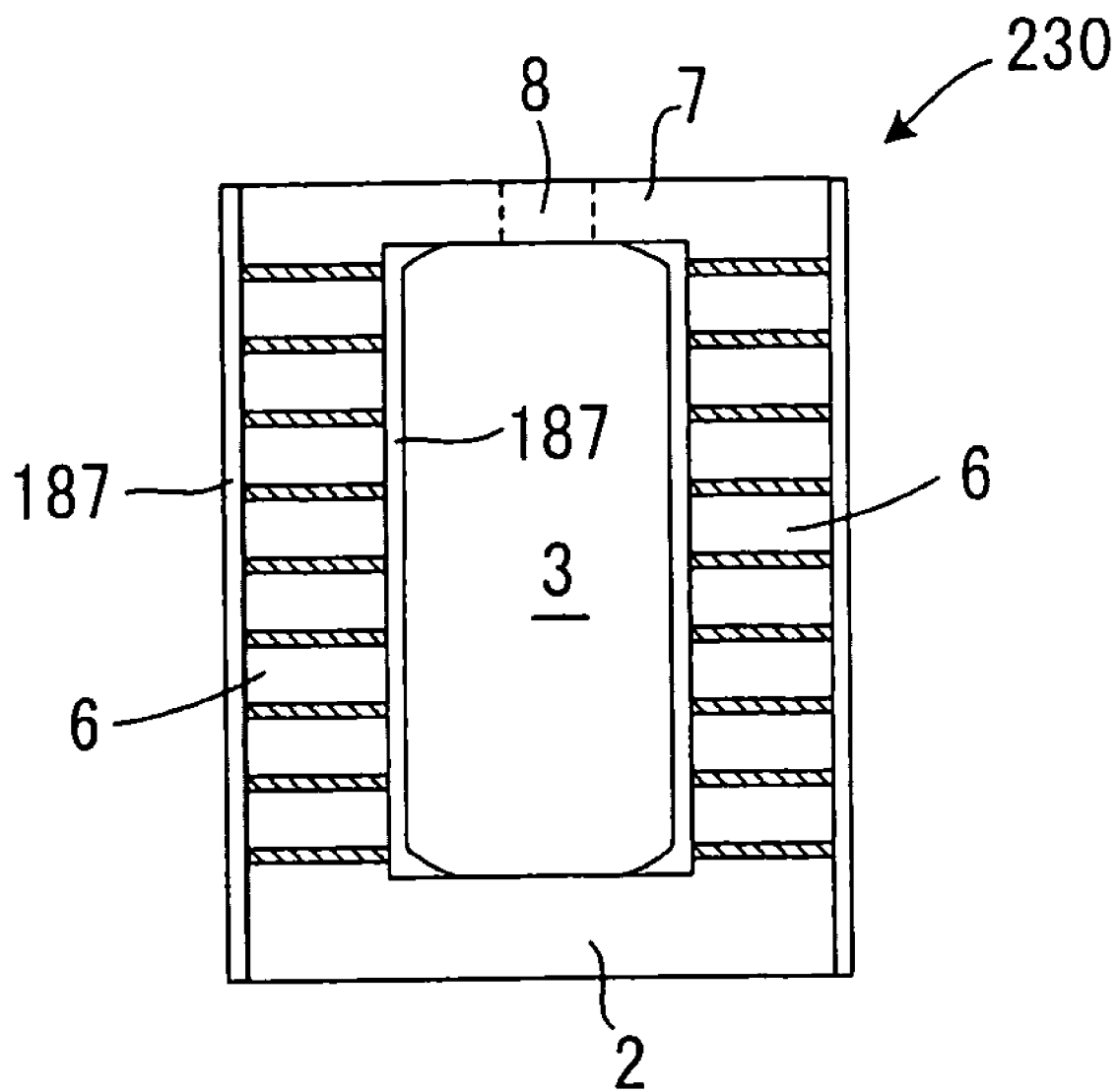
FIG. 13 is a cross-sectional view of the cell showing one embodiment of a second cell driving type piezoelectric/electrostrictive actuator according to the present invention.

FIG. 13 is a diagram showing a mode of a cell driving type piezoelectric/electrostrictive actuator obtained by reduction of the fluidity of the glass powder, and is a cross-sectional view of one cell and the wall portion defining the-cell. A shown cell driving type piezoelectric/electrostrictive actuator 230 is one embodiment of a second cell driving type piezoelectric/electrostrictive actuator according to the present invention, and comprises (a plurality of) cells 3 each formed by a wall portion including side walls 6, and a ceiling wall 7 and a bottom wall 2 connected to the side walls. The two side walls 6 comprise piezoelectric/electrostrictive operation portions, and a volume of the cell 3 changes by displacement of the piezoelectric/electrostrictive operation portion. The ceiling wall 7 comprises pores 8, and a glass insulating film 187 (thin film) which coats a part of the cell inner surface of the wall portion is formed. As a result of the reduction of the fluidity of the glass powder, the glass insulating films 187 do not coat all of the cell inner surfaces of the ceiling wall 7 and the bottom wall 2, and do not constitute a seamless thin film.

However, the glass insulating films 187 are formed in the vicinity of each connection portion between the side wall 6 and the ceiling wall 7, or between the side wall 6 and the bottom wall 2, and the cell driving type piezoelectric/electrostrictive actuator 230 has a preferable mode in that bonding between the side wall 6 which is the piezoelectric/electrostrictive operation portion causing the displacement and the ceiling wall 7 or the bottom wall 2 which is a fixed portion causing no displacement is strengthened. This is because stress is most applied to the connection portion between the side wall 6 which is the piezoelectric operation portion and the ceiling wall 7 or the bottom wall 2 which is the fixed portion at a driving time of the actuator. By this mode, even when two side walls 6 and the ceiling wall 7 and bottom wall 2 connected to the side walls are not integrally fired, a certain degree of enhancement of bonding reliability is recognized. However, needless to say, when the wall portion is fired/integrated, the bonding reliability is further enhanced. Furthermore, the use of the cell driving type piezoelectric/electrostrictive actuator 230 as a liquid discharge device in which the liquid is charged into the cell 3 has an important meaning from the viewpoint of prevention of liquid leakage.

Figure 9A:
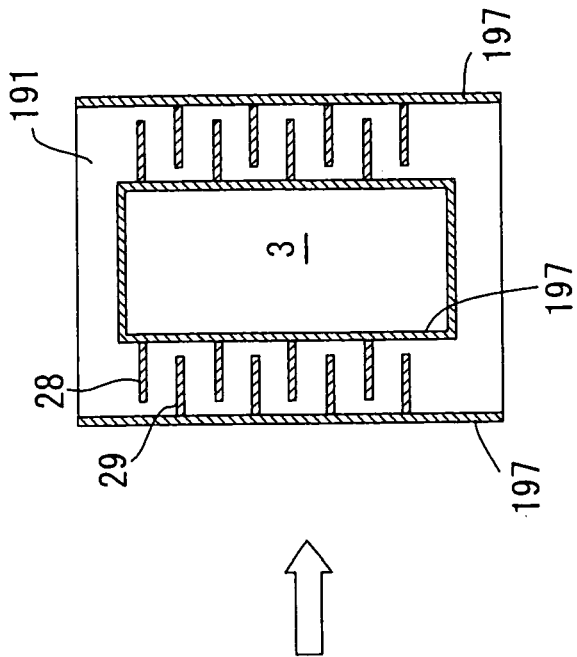
FIGS. 9(a) to 9(c) are explanatory views of film forming steps by a plating process.
Figure 9B:
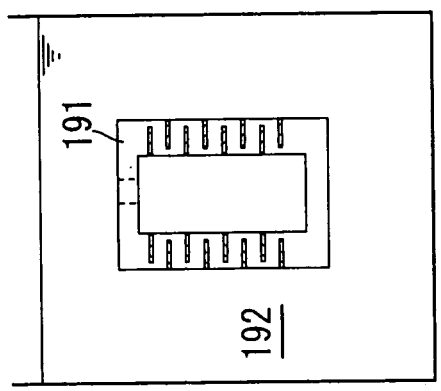
Figure 9C:
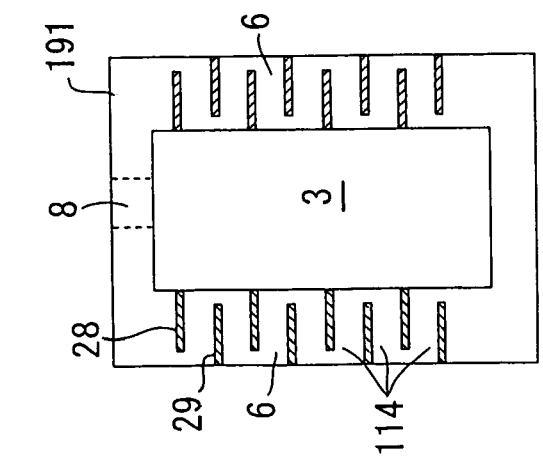

Next, a plating process which is film forming means will be described. FIGS. 9(*a*) to 9(*c*) are explanatory views of film forming steps by the plating process. In this method, for example, by an electroless plating process, a fired laminated body is immersed into an electrolytic solution containing metal ions, and metals are reduced and precipitated by chemical reaction to form an electrode film. The plating process is utilized as film forming means for forming the electrode film connected to one driving electrode on a cell outer surface and connected to the other driving electrode on a cell inner surface with respect to the fired laminated body obtained in a manufacturing process in a case where end portions of a pair of driving electrodes are buried in piezoelectric/electrostrictive bodies on one side and are exposed from the piezoelectric/electrostrictive bodies on the other side as in the cell driving type piezoelectric/electrostrictive actuator 140 (see FIG. 4). FIG. 9(*a*) is a cross-sectional view of the fired laminated body obtained in the manufacturing process of the cell driving type piezoelectric/electrostrictive actuator and subjected to film formation by the plating process. A fired laminated body 191 has a mode substantially equal to that of the cell driving type piezoelectric/electrostrictive actuator 140 before an electrode film and an insulating film are formed, and the end portions of a pair of driving electrodes 28, 29 are buried in piezoelectric/electrostrictive bodies 114 on one side, and are exposed from the piezoelectric/electrostrictive bodies 114 on the other side.

For example, conditions in a case where a nickel film is formed as the electrode film will be described hereinafter. In the plating process, a pretreatment is performed before performing plating. In the pretreatment, degreasing is first performed in order to remove mainly oily/fatty dirt adhering to the fired laminated body 191 which is an object of film formation. When the fired laminated body 191 is immersed, for example, in an ultrasonic bath into which, for example, a degreasing solution has been projected at 50° C. for five minutes, the degreasing is possible. Next, the fired laminated body 191 is immersed, for example, into a fluoroboric acid solution at 25° C. for five minutes, and the surface is etched. Moreover, the fired laminated body 191 is immersed, for example, into a dilute sulfuric acid solution at 25° C. for one minute, and deacidification is performed. Thereafter, palladium nucleus attaching is performed (at 25° C. every five minutes) by a sensitizer activater process.

The electrode film is formed with respect to the fired laminated body 191 pretreated as described above, for example, using an electroless nickel plating process. In the electroless nickel plating process, for example, a pH-adjusted plating solution 192 containing nickel salt, complexing agent, reducing agent or the like is prepared, and heated at 40° C., and the fired laminated body 191 is immersed into the plating solution 192 for 120 minutes also using ultrasonic waves (see FIG. 9(*b*)). Thereafter, cleaning is performed in pure water. By the above-described treatment, a nickel film 197 having a thickness of, for example, 2 μm can be formed on a desired surface of the fired laminated body 191 (see FIG. 9(*c*)). The nickel films 197 are electrode films corresponding to a pair of driving electrodes, and are thin films mentioned in the present invention.

Subsequently, a second method of manufacturing the cell driving type piezoelectric/electrostrictive actuator according to the present invention will be described. The second method of manufacturing the cell driving type piezoelectric/electrostrictive actuator according to the present invention is common to the first manufacturing method, and characterized in steps of forming a seamless thin film. The second manufacturing method is different from the first manufacturing method in that a drivable state of the actuator is brought before forming the thin film, piezoelectric/electrostrictive operation portions constituting side walls are driven, in other words, voltages are applied between a pair of driving electrodes of the piezoelectric/electrostrictive operation portions to contract/expand the side walls, cell volumes are changed, and film forming materials are introduced into the cell trough pores. The actuator which is an object is driven in this manner, while forming the thin film on the cell inner surface. Then, when the pores for introducing the film forming materials are very small, surface tension of a liquid is large, and it is not easy to introduce the film forming material into the cell, the film formation can be facilitated. This means can be said to be preferable also from a viewpoint that a gas generated by chemical reaction in the cell can be discharged out of the cell. When the film forming means uses chemical reaction, a gas generated as a byproduct is removed, and a reaction speed is maintained. This is an important factor for manufacturing a high-quality thin film. It is to be noted that in this case, a plating process using a liquid as the film forming material, an electrophoresis process, and an anodic oxidation process can be adopted as concrete film forming means.

The method is not limited except the above-described peculiar steps, and can comprise the step conforming to the first method of manufacturing the cell driving type piezoelectric/electrostrictive actuator according to the present invention. In the second manufacturing method, since the actuator is driven before forming the thin film, the method cannot be applied to a case where the thin film corresponds to the electrode film, for example, in the cell driving type piezoelectric/electrostrictive actuator 80, 90, or 140 (see FIGS. 7, 6, 4). However, the method is usable as means for preparing any cell driving type piezoelectric/electrostrictive actuator regardless of the mode as long as the actuator can be driven before forming the thin film.

In the second manufacturing method, concretely, the fired laminated body is first obtained by a ceramic green sheet stacking process in accordance with the first manufacturing method. The steps of obtaining the fired laminated body in accordance with the first manufacturing method have been described above with reference to FIGS. 10(*a*) to 10(*c*), and refer to a manufacturing method in which a preparation object is the cell driving type piezoelectric/electrostrictive actuator 110 (see FIG. 2). Moreover, the obtained fired laminated body is subjected to polarization of the piezoelectric/electrostrictive body if necessary. In the fired laminated body, the conductor films 318, 319 constituting the driving electrode, common wiring, and individual wiring are stacked, and conduct by the via-holes 128, 129 (see FIG. 10(*b*)). Therefore, when the power supply is connected between the via-holes 128, 129 via a tentative external wiring or the like, the body can be driven. Moreover, the fired laminated body is driven to contract/expand the side wall, and the volume of the cell is changed. Then, by the pressure change in the cell, the film forming material can be introduced into the cell through the pores 8 (see FIG. 10(*c*)), and the seamless thin film can be formed on the cell inner surface.

The method of manufacturing the cell driving type piezoelectric/electrostrictive actuator according to the present invention has been described above. Next, materials for use in the cell driving type piezoelectric/electrostrictive actuator according to the present invention, and the method of manufacturing the cell driving type piezoelectric/electrostrictive actuator according to the present invention will be described.

First, the material of the piezoelectric/electrostrictive body (piezoelectric/electrostrictive material) will be described. There are not any particular requirement as far as the piezoelectric/electrostrictive material causes strains induced by an electric field such as a piezoelectric effect or an electrostrictive effect. The material may be either crystalline or amorphous, or a semiconductor ceramic, ferroelectric ceramic, or antiferroelectric ceramic may be used. The material may be appropriately selected and used in accordance with applications. The material may require the polarization or not. Concrete examples of preferable materials include lead zirconate, lead titanate, lead magnesium niobate, lead nickel niobate, lean nickel tantalite, lead zinc niobate, lead manganese niobate, lead antimony stannate, lead manganese tungstate, lead cobalt niobate, lead magnesium tungstate, lead manganese tantalite, barium titanate, sodium bismuth titanate, bismuth neodymium titanate (BNT), potassium sodium niobate, strontium bismuth tantalite, copper barium tungsnate, bismuth ferrate, or a complex oxide containing at least two kinds of these materials.

Furthermore, in these materials, an oxide selected from the group consisting of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper and the like may be dissolved. Furthermore, lithium bismuthate, or lead germinate may be added to the above-described material. For example, such a material is a piezoelectric/electrostrictive material comprising a complex oxide of lead zirconate, lead titanate and lead magnesium niobate, and lithium bismuthate or lead germanate as an additive. This complex oxide containing material is preferably used since high material characteristics can be developed, while the piezoelectric body can be fired at low temperature. The firing of the piezoelectric material at the low temperature can be also achieved by adding a glass (e.g., a silicate glass, a borate glass, a phosphate glass, a germanate glass or any mixture thereof). The amount of the glass material to be added could be desirably chosen, depending upon the required performances of the device to be produced, since an excessive addition of the glass often causes the deterioration of the material characteristics of the device produced.

Next, as the material of the electrode, an electric conductor metal and an oxide is adopted. For example, in general, the electric conductor metal which is solid at room temperature is used as the material of the electrode. Examples include one of aluminum, titanium, chromium, iron, cobalt, nickel, copper, zinc, niobium, molybdenum, ruthenium, palladium, rhodium, silver, tin, tantalum, tungsten, iridium, platinum, gold, and lead, or an alloy of two or more of them, such as silver-platinum, silver-palladium and platinum-palladium. One material alone or a combination of two or more of the materials is preferably used. Alternatively, one may use a mixture between at least one of these materials mentioned above and any one of aluminum oxide, zirconium oxide, titanium oxide, silicon oxide, cerium oxide, glass, and the piezoelectric/electrostrictive material or a cermet thereof. These materials are preferably selected in accordance with the kind of the piezoelectric/electrostrictive material. As an oxide electrode, indium tin oxide (ITO), iridium oxide, or ruthenium oxide may be used. It is to be noted that the electrode mentioned herein is represented mainly by the electrode film, the driving electrode or the like, and the material of the electrode is a material constituting the conductor film forming the electrode later in the description of the manufacturing method. Materials conforming to those of the electrodes may be adopted in the materials constituting the via-holes, required electrode terminals, wirings and the like.

As the material of the protector film, silicon dioxide, silicon nitride, boric acid-phosphoric acid-silicic glass (BPSG), phosphoric acid-silicic glass (PSG) and the like are used in addition to bismuth-zinc-borosilicic glass. As the material of the insulating film, alumina oxide, titanium oxide or the like is used in addition to tantalum oxide. As the material of the moistureproof film, silicon dioxide, silicon nitride or the like is used. As the material of the barrier film, tantalum nitride, niobium nitride or the like is used in addition to titanium nitride described above.

Examples of an organic material which can be formed into a film by the CVD process include a parylene resin. The parylene resin can be formed into the film at room temperature, and is superior in insulation, resistance to chemicals, and water repellency. Therefore, this is a preferable material having functions of the insulating film, protector film, and moistureproof film according to the present invention.

The first and second cell driving type piezoelectric/electrostrictive actuators according to the present invention are applied as ink jet head for printing apparatuses, and are additionally preferably applicable as actuators for a micropump, a micro liquid discharge device for use in a mixing/reacting operation of a trace amount of a liquid in a biotechnology field, in manufacturing a DNA chip required for analysis of a gene structure, or in a coating step for manufacturing a semiconductor, and a trace-amount projection device of reagents for use in various inspections in a medical field.

What is claimed is:

1. A cell driving type piezoelectric/electrostrictive actuator comprising: one or a plurality of cells defined by a wall portion including side walls, a ceiling wall and a bottom wall, the side walls, the ceiling wall and the bottom wall being connected to form a space as a cell, at least two side walls facing each other comprising piezoelectric/electrostrictive operation portions, the piezoelectric/electrostrictive operation portions being displaced to change a volume of the cell, wherein at least one pore is disposed in the wall portion other than said at least two side walls comprising the piezoelectric/electrostrictive operation portions, and all inner surfaces of each cell defined by the wall portion are coated with one or more layers of seamless thin films.

2. The cell driving type piezoelectric/electrostrictive actuator according to claim 1, wherein the one or more layers of seamless thin films are selected from the group consisting of a barrier film, an electrode film, an insulating film, a protector film, and a moistureproof film.

3. The cell driving type piezoelectric/electrostrictive actuator according to claim 2, wherein the electrode film is formed of a metal or an oxide thereof in a case where the one or more layers of seamless thin films includes the electrode film.

4. The cell driving type piezoelectric/electrostrictive actuator according to claim 2, wherein the barrier film is formed of an oxide or a nitride in a case where the one or more layers of seamless thin films includes the barrier film.

5. The cell driving type piezoelectric/electrostrictive actuator according to claim 2, wherein the insulating film, the protector film, and the moistureproof film are formed of oxides, nitrides, or carbides in a case where the one or more layers of seamless thin films includes the insulating film, the protector film, and the moistureproof film.

6. The cell driving type piezoelectric/electrostrictive actuator according to claim 1, wherein the one or more layers of seamless thin flims comprise at least a barrier film and an electrode film, which are layered in this order from the inner surface of the wall portion.

7. The cell driving type piezoelectric/electrostrictive actuator according to claim 1, wherein the one or more layers of seamless thin films comprise at least one electrode film, and one or more films selected from the group consisting of an insulating film, a protector film, and a moistureproof film, and wherein said one or more layers of seamless thin film is any combination consisting of: at least the electrode film and the insulating film, at least the electrode film and the protector film, and at least the electrode film and the moistureproof film, wherein said at least one electrode film among said combinations is formed at a position closer to an inner surface of the wall portion among them.

8. The cell driving type piezoelectric/electrostrictive actuator according to claim 1, wherein a reaction layer formed by a reaction between a component of a material constituting the thin film and that of the material constituting the wall portion is formed between the seamless thin film and the wall portion.

9. The cell driving type piezoelectric/electrostrictive actuator according to claim 1, wherein the wall portion including side walls, the ceiling wall and the bottom wall is integrally fired.

10. The cell driving type piezoelectric/electrostrictive actuator according to claim 1, wherein each of the piezoelectric/electrostrictive operation portions constituting two side walls has layered piezoelectric/electrostrictive bodies and at least a pair of driving electrodes alternately stacked in a height direction of the side wall, and the displacement is generated by a vertical effect of an electric field induced strain.

11. The cell driving type piezoelectric/electrostrictive actuator according to claim 1, wherein each of the piezoelectric/electrostrictive operation portions constituting two side walls has platy piezoelectric/electrostrictive bodies and at least a pair of driving electrodes alternately stacked in a width direction of the side wall, and the displacement is generated by a transverse effect of an electric field induced strain.

12. A liquid discharge device which comprises at least one of cell driving type piezoelectric/electrostrictive actuators comprising: one or a plurality of cells defined by a wall portion including side walls, a ceiling wall and a bottom wall, the side walls, the ceiling wall and the bottom wall being connected to form a space as a cell, at least two side walls facing each other comprising piezoelectric/electrostrictive operation portions, the piezoelectric/electrostrictive operation portions being displaced to change a volume of the cell,
wherein at least one pore is disposed in the wall portion other than said at least two side walls comprising the piezoelectric/electrostrictive operation portions, and all inner surfaces of each cell defined by the wall portion are coated with one or more layers of seamless thin films.

13. The liquid discharge device according to claim 12, in which the cell constitutes a liquid pressurizing chamber and which is capable of discharging a liquid charged in the cell and containing particles by a change of a volume of the cell by displacement of the piezoelectric/electrostrictive operation portion,
wherein a surface potential of an outermost layer facing a cell inner surface among the one or more layers of seamless thin films has the same polarity as that of the surface potential of the particles contained in the liquid.

14. A method of manufacturing a cell driving type piezoelectric/electrostrictive actuator comprising: one or a plurality of cells each defined by a wall portion including side walls, a ceiling wall, and a bottom wall, the side walls, the ceiling wall and the bottom wall being connected to form a space as a cell, at least two side walls facing each other comprising piezoelectric/electrostrictive operation portions, wherein at least one pore is disposed in the wall portion other than said at least two side walls comprising the piezoelectric/electrostrictive operation portions, and all inner surfaces of the wall portion defining the cell are coated with one or more layers of seamless thin films, the method comprising the steps of:
preparing at least two side walls facing each other of a wall portion including a piezoelectric/electrostrictive body,
forming at least one pore in the wall portion other than said at least two side walls comprising the piezoelectric/electrostrictive operation portions to form the cell,
introducing a film forming material into each cell through said at least one pore formed, and
forming at least one seamless thin film so as to coat all the inner surfaces of the wall portion defining each cell by a predetermined film forming means.

15. The method of manufacturing the cell driving type piezoelectric/electrostrictive actuator according to claim 14, wherein the film forming material is a gaseous material.

16. The method of manufacturing the cell driving type piezoelectric/electrostrictive actuator according to claim 14, wherein either a CVD process or an evaporation polymerization process is employed as a film forming means.

17. The method of manufacturing the cell driving type piezoelectric/electrostrictive actuator according to claim 14, wherein the film forming material is a liquid material.

18. The method of manufacturing the cell driving type piezoelectric/electrostrictive actuator according to claim 17, wherein a plating process is employed as a film forming means.

19. The method of manufacturing the cell driving type piezoelectric/electrostrictive actuator according to claim 14, further comprising the steps of:
exposing an electrode on the inner surface of the wall portion defining the cell at time of forming the cell;
introducing a liquid film forming material into each cell through said at least one pore to deposit the material on at least the electrode using an electrophoresis process as a film forming means; and
performing a thermal treatment at a temperature which is not less than a softening temperature of the film forming material.

20. The method of manufacturing the cell driving type piezoelectric/electrostrictive actuator according to claim 19, wherein the thermal treatment is performed at least twice.

21. The method of manufacturing the cell driving type piezoelectric/electrostrictive actuator according to claim 19, wherein the seamless thin film is a complex material which is formed by subjecting a mixture of two or more types of film forming materials.

22. The method of manufacturing the cell driving type piezoelectric/electrostrictive actuator according to claim 19, further comprising the steps of: allowing at least one component of the film forming material to react with at least one component of the material constituting the wall portion to form a reaction layer between the seamless thin film and the wall portion.

23. The method of manufacturing the cell driving type piezoelectric/electrostrictive actuator according to claim 14, wherein a diameter of the pore is 200 μm or less.

24. The method of manufacturing the cell driving type piezoelectric/electrostrictive actuator according to claim 14, wherein a green sheet stacking process is employed at time of preparing at least two side walls and the bottom wall in the wall portion defining each cell, and said stacking method comprises the steps of
processing holes in a plurality of ceramic green sheets containing a piezoelectric/electrostrictive material as a main component;
stacking said plurality of the sheets; and
integrally firing thus stacked sheets.

25. The method of manufacturing the cell driving type piezoelectric/electrostrictive actuator according to claim 14, wherein a green sheet stacking process is employed at time of preparing all of at least two side walls, the bottom wall and the ceiling wall in the wall portion defining each cell, and said stacking method comprises the steps of:
processing holes in a plurality of ceramic green sheets containing a piezoelectric/electrostrictive material as a main component;
stacking said plurality of ceramic green the sheets; and
integrally firing thus stacked sheets.

26. A method of manufacturing a cell driving type piezoelectric/electrostrictive actuator comprising: one or a plurality of cells each defined by a wall portion comprising side walls inclusive of at least two side walls facing each other and comprising piezoelectric/electrostrictive operation portions, a ceiling wall and a bottom wall, the side walls, the ceiling wall and the bottom wall being connected to form a space as a cell, wherein at least one pore is disposed in the wall portion other than said two side walls comprising the piezoelectric/electrostrictive operation portions, and all inner surfaces of the wall portion defining each cell are coated with one or more layers of seamless thin films, the method comprising the steps of:

preparing at least two side walls facing each other using a material for a piezoelectric/electrostrictive operation portions to form a cell together with remaining walls, disposing at least one pore in the wall portion other than said at least two side walls comprising the piezoelectric/electrostrictive operation portions, and setting the cell to be drivable as an actuator;

driving the piezoelectric/electrostrictive operation portions constituting the side walls to change a volume of the cell so as to introduce a film forming material into the cell through said at least one pore, and forming a seamless thin film so as to coat all inner surfaces of the wall portion defining each cell by predetermined film forming means.

27. A cell driving type piezoelectric/electrostrictive actuator comprising: one or a plurality of cells defined by a wall portion including side walls, a ceiling wall and a bottom wall, the side walls, the ceiling wall and the bottom wall being connected to form a space as a cell, at least two side walls facing each other comprising piezoelectric/electrostrictive operation portions, the piezoelectric/electrostrictive operation portions being displaced to change a volume of the cell, wherein at least one pore is disposed in the wall portion other than said two side walls facing each other and comprising the piezoelectric/electrostrictive operation portions, and wherein inner surfaces of side walls, and inner surfaces of connection portions of side walls, the ceiling wall and the bottom wall are coated with one or more layers of seamless thin films, thereby connection reliabilities of side walls, the ceiling wall and the bottom wall are enhanced, and wherein less than the entirety of the bottom wall is covered by the one or more layers of seamless thin films.

* * * * *

UNITED STATES PATENT AND TRADEMARK OFFICE
CERTIFICATE OF CORRECTION

PATENT NO. : 7,196,455 B2 Page 1 of 1
APPLICATION NO. : 10/971525
DATED : March 27, 2007
INVENTOR(S) : Makoto Ohmori and Koji Kimura It is certified that error appears in the above-identified patent and that said Letters Patent is hereby corrected as shown below:

Column 4

*Line 16*: please add --a-- before "layered" and change "bony" to --body--
*Line 52*: please add --,-- after "body"

Column 32

*Line 39*: please change "flims" to --films--

Signed and Sealed this

Twenty-ninth Day of May, 2007

JON W. DUDAS
*Director of the United States Patent and Trademark Office*